(12) United States Patent
Srinivasan et al.

(10) Patent No.: US 11,656,296 B2
(45) Date of Patent: May 23, 2023

(54) BATTERY ANALYSIS SYSTEM AND METHOD

(71) Applicant: Zitara Technologies, Inc., Oakland, CA (US)

(72) Inventors: Shyam Srinivasan, Oakland, CA (US);
Evan Murphy, Oakland, CA (US);
Jacqueline Maslyn, Oakland, CA (US);
Dustin Summy, Oakland, CA (US);
Brian Goodall, Oakland, CA (US);
Sharon R. Kuo, Oakland, CA (US);
Megan Pitcavage, Oakland, CA (US);
Zachary Gima, Oakland, CA (US);
John Stefanski, Oakland, CA (US)

(73) Assignee: Zitara Technologies, Inc., San Francisco, CA (US)

( * ) Notice: Subject to any disclaimer, the term of this patent is extended or adjusted under 35 U.S.C. 154(b) by 0 days.

(21) Appl. No.: 17/502,565

(22) Filed: Oct. 15, 2021

(65) Prior Publication Data

US 2022/0034974 A1 Feb. 3, 2022

Related U.S. Application Data

(63) Continuation of application No. 17/314,867, filed on May 7, 2021.

(Continued)

(51) Int. Cl.
| | |
|---|---|
| *G01R 31/396* | (2019.01) |
| *G01R 31/374* | (2019.01) |
| *H01M 10/42* | (2006.01) |
| *H01M 10/48* | (2006.01) |
| *G01R 31/3842* | (2019.01) |

(52) U.S. Cl.
CPC ........ *G01R 31/396* (2019.01); *G01R 31/374* (2019.01); *G01R 31/3842* (2019.01); *H01M 10/425* (2013.01); *H01M 10/48* (2013.01); *H01M 10/482* (2013.01);
(Continued)

(58) Field of Classification Search
USPC .......................... 324/426, 432–435; 702/63
See application file for complete search history.

(56) References Cited

U.S. PATENT DOCUMENTS

| | | | |
|---|---|---|---|
| 6,656,234 | B2 | 12/2003 | Dexter et al. |
| 7,554,294 | B2 | 6/2009 | Srinivasan et al. |

(Continued)

FOREIGN PATENT DOCUMENTS

| | | |
|---|---|---|
| CN | 111438077 A | 7/2020 |
| DE | 102019111956 A1 | 11/2020 |

(Continued)

OTHER PUBLICATIONS

"Meta-Model Mechanism", https://www.cs.wmich.edu/~ooda/metamodel.html, Nov. 19, 2021.
(Continued)

*Primary Examiner* — Vincent Q Nguyen
(74) *Attorney, Agent, or Firm* — Jeffrey Schox; Randy Mehlenbacher

(57) ABSTRACT

A system or method for determining a battery state can include generating a set of models based on a measured response of a plurality of batteries to an applied load, measuring battery properties of a battery, and using a state estimator to determine a battery state associated with a battery.

8 Claims, 14 Drawing Sheets

Related U.S. Application Data

(60) Provisional application No. 63/021,604, filed on May 7, 2020, provisional application No. 63/168,015, filed on Mar. 30, 2021.

(52) U.S. Cl.
CPC .. *H01M 10/486* (2013.01); *H01M 2010/4271* (2013.01); *H01M 2010/4278* (2013.01); *H01M 2220/20* (2013.01)

(56) References Cited

U.S. PATENT DOCUMENTS

| | | |
|---|---|---|
| 7,847,558 B2 | 12/2010 | Runkle et al. |
| 7,894,512 B2 | 2/2011 | Beadle et al. |
| 8,723,527 B2 | 5/2014 | Kudo et al. |
| 8,961,004 B2 | 2/2015 | Srinivasan et al. |
| 9,593,952 B2 | 3/2017 | Goodall et al. |
| 9,726,730 B2 | 8/2017 | Gross |
| 10,153,521 B2 | 12/2018 | Beaston |
| 10,295,606 B2 | 5/2019 | McCoy |
| 10,310,022 B2 | 6/2019 | Park et al. |
| 10,422,834 B2 | 9/2019 | Tang |
| 10,446,879 B2 | 10/2019 | Povey et al. |
| 10,656,209 B2 | 5/2020 | Jeon |
| 10,818,981 B2 | 10/2020 | Srinivasan et al. |
| 10,969,752 B1 | 4/2021 | Brink |
| 11,097,633 B1* | 8/2021 | Kohn ................. H02J 7/00 |
| 2004/0024559 A1 | 2/2004 | Down et al. |
| 2010/0070220 A1 | 3/2010 | Darilek |
| 2011/0196633 A1 | 8/2011 | Abe et al. |
| 2012/0098481 A1 | 4/2012 | Hunter et al. |
| 2012/0175953 A1 | 7/2012 | Ohkawa et al. |
| 2013/0069660 A1 | 3/2013 | Bernard et al. |
| 2014/0244225 A1 | 8/2014 | Balasingam et al. |
| 2015/0046108 A1 | 2/2015 | Akamine |
| 2015/0268309 A1 | 9/2015 | Kim |
| 2015/0280294 A1 | 10/2015 | Shin et al. |
| 2015/0304772 A1 | 10/2015 | Risberg et al. |
| 2015/0369875 A1 | 12/2015 | Ishii |
| 2017/0003352 A1 | 1/2017 | Barre et al. |
| 2017/0199247 A1 | 7/2017 | Joe |
| 2017/0288414 A1 | 10/2017 | Klein et al. |
| 2017/0350944 A1 | 12/2017 | Pajovic et al. |
| 2018/0083461 A1 | 3/2018 | Ravi et al. |
| 2018/0095141 A1 | 4/2018 | Wild et al. |
| 2018/0111599 A1 | 4/2018 | Wang et al. |
| 2018/0136285 A1 | 5/2018 | You et al. |
| 2018/0292465 A1 | 10/2018 | Osara et al. |
| 2019/0036356 A1 | 1/2019 | Subbaraman et al. |
| 2019/0235027 A1 | 8/2019 | Sugiura et al. |
| 2019/0339330 A1 | 11/2019 | Bryngelsson et al. |
| 2020/0070682 A1 | 3/2020 | Hellgren |
| 2021/0055348 A1 | 2/2021 | Kim et al. |
| 2021/0280920 A1* | 9/2021 | Rinaldo ................. H01M 10/48 |

FOREIGN PATENT DOCUMENTS

| | | |
|---|---|---|
| DE | 102019111958 A1 | 11/2020 |
| DE | 102019111976 A1 | 11/2020 |
| DE | 102019111979 A1 | 11/2020 |
| DE | 102019121461 B3 | 12/2020 |
| WO | 2020036775 A1 | 2/2020 |

OTHER PUBLICATIONS

Gima, Zachary, et al., "Optimal Sensor Selection for an Electrochemical Li-Ion Battery Model", 2020 ECS —The Electrochemical Society, vol. MA2020-01, A04: Student Battery Slam 4.

Merkle, Lukas, et al., "Architecture of a Digital Twin for Enabling Digital Services for Battery Systems", 2019 IEEE International Conference on Industrial Cyber Physical Systems (ICPS), Taipei, Taiwan, May 6-9, 2019.

Severson, Kristen A., "Data-driven prediction of battery cycle life before capacity degradation", Nature Energy, 4, pp. 383-391 (2019), Mar. 25, 2019.

* cited by examiner

BATTERY ANALYSIS SYSTEM AND METHOD

CROSS-REFERENCE TO RELATED APPLICATIONS

This application is a continuation of U.S. patent application Ser. No. 17/314,867 filed on 7 May 2021, which claims the benefit of U.S. Provisional Application No. 63/021,604, filed 7 May 2020, and U.S. Provisional Application No. 63/168,015, filed 30 Mar. 2021, each of which is incorporated in its entirety by this reference.

TECHNICAL FIELD

This invention relates generally to the battery management field, and more specifically to a new and useful system and method in the battery management field.

BACKGROUND

Performance of battery systems (e.g., battery cells, battery packs, electricity storage systems) and battery-powered devices or systems is often dependent upon battery system state and battery operating conditions (e.g., control inputs, environment conditions, etc.). By changing battery operating conditions, performance of battery systems (and systems or devices powered by such battery systems) can change. Additionally, change in operating conditions can affect longevity and economic value of battery systems.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1:
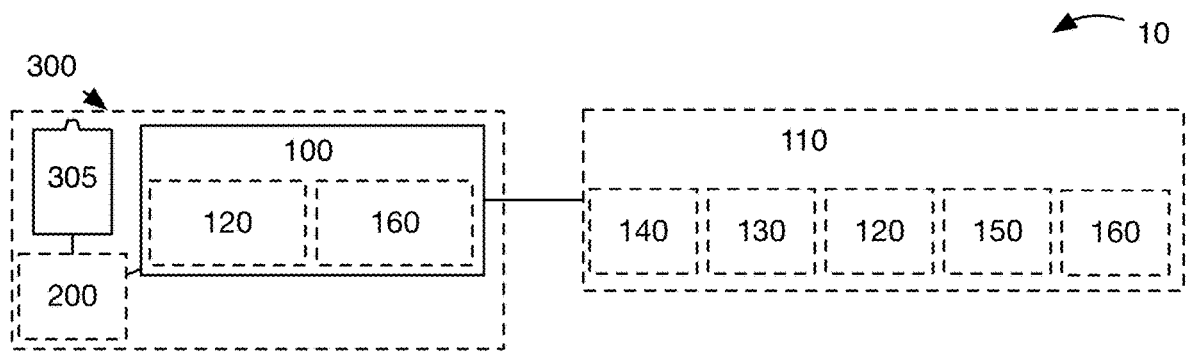
FIG. 1 is a schematic representation of the system.

As shown in FIG. 1, the system can include a computing system. The system can optionally include: a sensor, a battery system, a remote computing system, and/or any suitable components. The computing system(s) can optionally include: a state estimator, a simulation engine, a communication module, a model generator, a characterization module, and/or any suitable modules. However, the system can include any suitable components.

Figure 2:
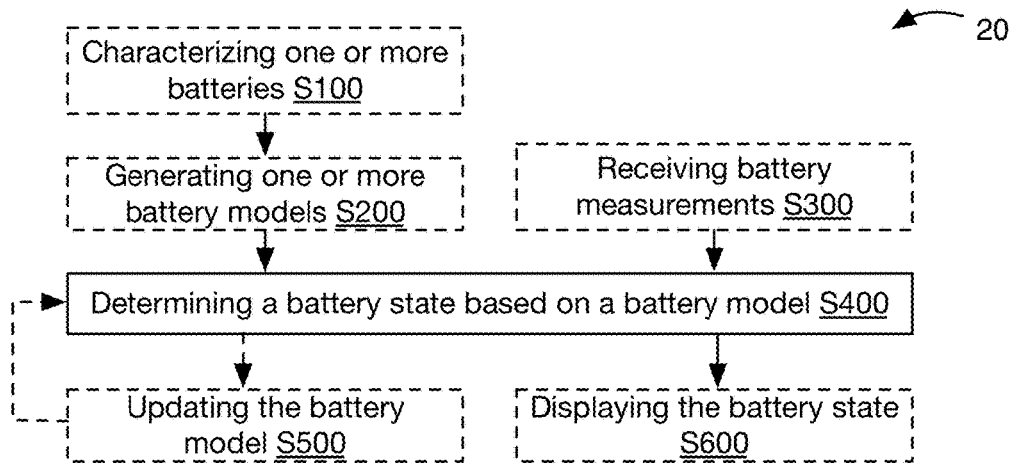
FIG. 2 is a schematic representation of an embodiment of the method.

As shown for example in FIG. 2, the method can include determining a battery state using a battery model. The method can optionally include characterizing one or more batteries S100, generating one or more battery models S200. The method can additionally or alternatively include: receiving battery measurements S300, updating the battery model(s) S500, displaying the battery state S600, and/or any suitable steps.

The system and method preferably function to determine (e.g., generate, evaluate, validate, select, identify, etc.) one or more battery models and use the battery models to determine (e.g., estimate, calculate, predict, etc.) battery properties during or resulting from use of the battery. However, the system and/or method can optionally perform any suitable function.

2. Benefits.

Variations of the technology can confer several benefits and/or advantages.

First, variants of the technology can enable or improve (e.g., increase the accuracy of, increase the speed of, etc.) battery state estimation on compute limited resources (e.g., a processor collocated with the battery). In specific examples, distributing the computation of the state between a remote computing system (e.g., that is not compute limited) and a local computing system (e.g., that is compute limited) can facilitate the battery state estimation. For instance, the remote computing system can generate states (e.g., in a look-up table) that can be provided to the local computing system, where the local computing system can determine the battery states using the look-up table.

Second, variants of the technology can validate the models and/or state estimator to ensure a threshold accuracy and/or precision of the estimated or predicted states. For example, the model(s) and/or state estimator(s) can be validated by comparing predicted states (generated using the model and/or state estimator) to measured states for analogous load profiles and analogous batteries.

Third, variants of the models can be modular, enabling models to be selected and/or modified based on a selection criterion (e.g., an application of the battery system, an accuracy of the estimated states, amount of compute available, etc.). In specific examples, the modularity can be enabled by using lumped models, by separating the models into discrete portions (e.g., separating the effects of thermal loading from electrical properties), and/or otherwise be enabled.

Fourth, variants of the technology can enable estimation of a state of a battery in real-time (e.g., during operation of an external system) and/or before operating the external system. In related variants, the technology can enable state estimation despite the problem being nonlinear (and/or including nonlinear effects). Specific examples can enable the state estimation based on the models and/or state estimators that are used.

Fifth, variants of the technology can estimate (and/or optimize) an external system's useful lifetime and/or economic value. In specific examples, the models can be simulated forward in time (e.g., using a simulation engine, using a state estimator propagating forward in time, etc.) to predict the future performance of external system(s).

Sixth, variants of the technology can monitor and analyze a battery in real-time with limited computational resources. For example, the technology can leverage different versions of an analysis model that each are tuned for a different battery state of a given battery pack. This allows the locally deployed models to be extremely small, fast, and efficient.

However, variants of the technology can confer any other suitable benefits and/or advantages.

3. System.

The system preferably functions to determine (e.g., generate, evaluate, validate, select, identify, etc.) one or more battery models, use the battery models to determine (e.g., estimate, calculate, predict, simulate, etc.) battery properties during or resulting from use of the battery, characterize one or more batteries for a response to an applied load, determine (e.g., detect) an anomalous battery operation conditions, and/or otherwise functions. As shown for example in FIG. 1, the system can include a computing system. The system can optionally include: a sensor, a battery system (e.g., an external system, a battery, etc.), a remote computing system, and/or any suitable components.

Portions of (including but not limited to the entire) the system can be collocated with (e.g., mounted to, integrated into, etc.) an external system, where the external system functions to perform one or more operation or application. Exemplary operations or applications include: data retrieval or transmission, image acquisition, package delivery, personal transportation, group transportation, data processing, performing one or more instance of the method as described below, system reorientation and/or repositioning, and/or any suitable operation(s). Exemplary external systems include: unmanned aerial vehicles (e.g., UAVs, drones, etc), satellites, rovers, electric vehicles (e.g., electric cars, electric trucks, shipping vehicles, buses, trains, electric passenger vehicles, etc.), electric submarines, electric boats, user devices (e.g., smart phones, computers, power tools, yard tools, etc.), electrical generators, consumer electronics, electric bicycles, scooters (e.g., electric scooters, electric motorbikes, etc.), mobility scooters, wheelchairs, personal transporters (e.g., kick scooters, electric skateboards, self-balancing unicycles, Segway, etc.), electric airplanes, construction equipment, and/or any suitable external system.

The external system(s) can be stand-alone or custom systems, part of a fleet or group of systems, one of a group of common systems (e.g., manufactured by the same entity, manufactured in the same processing plant, manufactured for the same end user, manufactured to achieve the same specifications, etc.), and/or otherwise be related or unrelated.

The external system(s) preferably include one or more batteries which functions to provide power to the external system and/or a component thereof (e.g., a motor, a camera, a computing system, etc.). The battery(s) are preferably a secondary cell (e.g., rechargeable), but can be a primary cell (e.g., not rechargeable) and/or any suitable battery, capacitor, and/or supercapacitor. The battery is preferably a lithium battery (e.g., a cathode of the battery includes a lithium material such as lithium nickel manganese cobalt oxide, lithium nickel aluminium cobalt oxide, lithium manganese oxide, lithium iron phosphate, lithium cobalt oxide, lithium oxide, lithium iron oxide, lithium copper oxide, etc.; an electrolyte of the battery includes lithium ion sources such as lithium hexafluorophosphate, lithium hexafluoroarsenate, lithium perchlorate, lithium tetrafluoroborate, lithium triflate, lithium tetrachloraluminate, lithium bromide, lithium iodide, lithium chloride, lithium tetrachlorogalate, etc.; an anode of the battery includes lithium material such as lithium titanate; etc.). However, the batteries can include one or more: lead batteries, nickel batteries, aluminum batteries, glass batteries, magnesium batteries, molten salt batteries, microbial batteries, organic radical batteries, polymer polysulfide bromide batteries, sand batteries, silicon batteries, silver batteries, sodium batteries, zinc batteries, and/or any suitable batteries.

The battery(s) are preferably the primary source of power for the external system, but can be an auxiliary power source, a back-up power source, a secondary power source, a tertiary power source, and/or otherwise provide power to any portion of the external system.

Each battery can include one or more: battery cells (e.g., a container to store chemical energy such as a prismatic battery cell, pouch battery cell, cylindrical battery cell, etc.; including an anode, cathode, separator, electrolyte, etc.), battery modules (e.g., groups or clusters of battery cells), battery packs (e.g., an enclosure that includes one or more battery cells or battery modules, processors configured to run software, heating and/or cooling systems, etc. that delivers power to the components of the external system), and/or any suitable components. A battery pack can include any number of battery cells and/or battery modules between about 1 and 10,000 battery cells or modules. However, a battery pack can include more than 10,000 battery cells or modules. A battery module can include any number of battery cells between about 1 and 10,000 battery cells. However, a battery module can include more than 10,000 battery cells. An external system can include between 1 and 10,000 battery packs. However, an external system can include greater than 10,000 battery packs.

Each battery 305 can be described by a set of battery properties. The battery properties can be cell-specific properties, module-specific properties, pack-specific properties, generic properties, and/or any suitable properties. The properties can be static (e.g., fixed such as determined at the time of installation or manufacture) and/or variable (e.g., change during operation of the battery, change over time as the battery ages, change depending on the number of battery operation cycles, etc.). Battery properties can be: directly measured; calculated, derived, inferred, or estimated (e.g., from directly measured battery properties, from simulations, from charging or discharging the battery, etc.); received (e.g., from a manufacturer, from an operator, from a data sheet, etc.), and/or otherwise be accessed. Battery properties can include internal battery properties and external battery properties (e.g., properties associated with an environment that the battery is in). Exemplary battery properties include: voltage (e.g., open circuit voltage, instantaneous voltage, end-of-life voltage, beginning of life voltage, voltage limits, etc.), current (e.g., short circuit current, instantaneous current, end-of-life current, beginning-of-life current, current limits, taper currents, etc.), temperature (e.g., internal temperature, surface temperature, environment temperature, set temperature, local temperature, average temperature, etc.), temperature gradient, humidity, pressure (e.g., environmental pressure, mechanical pressure, air pressure, etc.), resistance (e.g., internal resistance, ohmic resistance, capacitive resistance, inductive resistance, etc.), impedance, capacity (e.g., specific capacity), capacitance (e.g., effective capacitance), inductance, component thickness (e.g., anode thickness, cathode thickness, separator thickness, solid-electrolyte interface layer thickness, etc.), particle radius (e.g., anode particle radius, cathode particle radius), transference number, Brugman number, solution diffusivity, solution volume fraction (e.g., anode, cathode, separator, etc. solution volume fraction), diffusivity (e.g., anode solid diffusivity, cathode solid diffusivity, etc.), reaction rate (e.g., anode reaction rate, cathode reaction rate, etc.), materials (e.g., cathode material, anode material, electrolyte material, separator, etc.), geometry, solution conductivity, entropic heating coefficient, thermal conductivity, electrical conductivity, thermal mass, C-rate (e.g., nominal C-rate, maximum C-rate, etc.), charge (e.g., maximum charge, charge current limit, discharge current limit, delivered charge, stored charge, etc.), state (SoX) of the battery (e.g., state of charge (SoC), state of health (SoH), state of power (SoP), state of safety (SoS), etc.), energy (e.g., energy delivered since last charge or discharge, total energy delivered for a given period of time, etc.), time (e.g., time since last charge or discharge, age, remaining lifetime, etc.), ion concentration (e.g., lithium ion concentration), and/or any suitable properties.

The sensor(s) 200 function to measure one or more battery property, external system property, environmental condition (e.g., of an environment proximal to, surrounding, adjacent to, near, etc.) of the battery or external system, and/or any suitable properties. The sensors are preferably connected to (e.g., in contact with) the battery(s), but can be collocated with (e.g., mounted to) the external system, remote from the external system (e.g., a wireless sensor), and/or otherwise be configured. In variants, each cell of a battery can include a sensor, each module of a battery can include a sensor, each battery pack can include a sensor, a subset of cells can include a sensor, a subset of modules can include a sensor, a subset of packs can include a sensor, and/or the sensor can otherwise be associated with any suitable battery(s). Exemplary sensors include: battery management systems (BMS) monitors, thermometers, pressure gauges, external system sensors (e.g., odometers, altimeters, power sensors, etc.), anemometer, weather sensors (e.g., illumination sensors, humidity sensors, road condition sensors, etc.), clocks, electrochemical impedance spectroscopy (EIS) sensors, voltmeters, ammeters, ohmmeter, multimeter, and/or any suitable sensors.

When the external system is part of a system fleet, each external system can include the same or a different suite of sensors. In an illustrative example, a subset of external systems (e.g., less than 0.001%, 0.001%, 0.01%, 0.1%, 1%, 10%, 20%, 50%, 60%, 70%, 80%, 90%, 95%, 100%, or values therebetween) within a fleet can include EIS sensors, where data generated from this subset of external systems can be used (e.g., have a larger weight relative to other external systems, be used exclusively, etc.) in the generation of battery models and/or updating battery models. However, the external systems and/or batteries can include any suitable sensors.

The computing system 100 preferably functions to perform one or more steps of the method (e.g., as described below). However, the computing system can additionally or alternatively function to receive data, process data, store data, and/or can otherwise function. The computing system is preferably distributed between an edge computing system 105 (e.g., collocated with the battery or external system) and a remote computing system 110 (e.g., a server, cloud computing system, a computing system of an operations center, etc.). However, the computing system can be distributed between a battery computing system and an external computing system, can be a remote computing system, can be a local (e.g., edge) computing system, and/or can be distributed in any manner. In a first illustrative example, the entire computing system can be collocated with a battery. In a second illustrative example, a first set of processes can be performed by a processor collocated with the battery and a second set of processes can be performed by a cloud computing system. In a third illustrative example the computing processes can be performed at the cloud. However, the computing system can otherwise be configured or distributed. The computing system can include any suitable processors, microprocessors, memory, controllers, and/or other components.

The computing system can include: a model generator 140, a state estimator 120, a simulation engine 130, a validation engine 150, a communication module 160, and/or any suitable components.

The model generator 140 preferably functions to generate (e.g., initialize, update, select, etc.) a set of models 145 which can be used to determine (e.g., calculate, estimate, etc.) a battery state. The model generator is preferably part of a remote computing system, but can be integrated on an edge computer and/or any suitable computing system. The set of models can be unique (e.g., to a given battery, to a given external system, to a fleet of external system, to a battery class such as batteries sharing one or more battery property, etc.) and/or generic. Each model of the set of models can function to describe (e.g., mathematically describe) or represent a battery and/or external system. For example, each model can provide a differing representation of the battery (e.g., with differing degrees of accuracy, computation needed, etc.).

The set of models can include battery models, sensor models, and/or any suitable models. The sensor model(s) 141 can function to model how sensor data is acquired, an error associated with sensor measurements, sensor biases, and/or otherwise model the sensor behavior. The battery models are preferably physical models (e.g., model a physical aspect of the battery; model battery physics; etc.), but can alternatively be conceptual models or other models. The battery models 142 can function to model (e.g., form a representation of) how the battery operates and/or responds to charging or discharging. For example, battery models can simulate electrical effects, thermal effects, diffusion effects, ion effects, electrochemical effects, and/or any suitable effects.

The models are preferably parameterized models, but can be or include nonparameterized models, machine learning models (e.g., neural networks), and/or any suitable model types. Parameterization generally refers to what independent variables are associated with a dependent variable and a functional form for how the dependent variable changes with the independent variable. Parameterization can additionally or alternatively include: what elements are lumped together (e.g., how many individual units are described by a given term), and/or otherwise be defined. In an illustrative example, open-circuit voltage (U) can be parameterized as a function of state of charge (SoC), temperature (T, e.g., internal temperature of the battery, environmental temperature, etc.), and/or age of the battery such as: $U(SoC,T,age)$, $U(SoC, age)$, $U(T, age)$, $U(SoC,T)$, $U(SoC)$, $U(T)$, $U(age)$, or $U$; where $f(x)$ means function $f$ of independent variables $x$.

Exemplary functional relationships include: polynomials (e.g., constant, linear, quadratic, cubic, quartic, quintic, etc.), exponentials, logarithms, trigonometric functions, logistic functions, hyperbolic functions, sigmoidal functions, radical functions (e.g., square roots, cube roots, etc.), rational functions, transcendental functions, power functions, special functions (e.g., Bessel functions, hypergeometric functions, error functions, delta functions, sine functions, etc.), differentials (e.g., differentials with respect to time, space, battery properties, etc.), integrals (e.g., with respect to time, space, battery properties, etc.), and/or any suitable functions.

Each parameterization is preferably associated with a set of parameters, where the set of parameters scale or otherwise relate the independent variable to a dependent variable. For instance, in the parameterization of U(SoC, T)=A*SoC+ B*T+C; A, B, and C are the set of parameters.

Typically, the independent variables will be associated with (e.g., be, be derived from, be associated with, etc.) one or more sensor measurements. However, the independent variables can additionally or alternatively include: states (e.g., estimated by a state estimator), simulated system properties, and/or any suitable variables. When a variable is not directly measured (e.g., is determined by combining one or more other measured quantities), the variable can be referred to as a 'hidden variable.' However, a hidden variable can otherwise be defined.

The parameters can be active or inactive. Active parameters are preferably parameters that are updated during the use of (e.g., evaluation of, training, determination of, etc.) the model. Inactive parameters are preferably parameters that do not change while using the model. The identification of a parameter as an active or inactive parameter can be depend on: a relationship between the parameter and a physical model (e.g., a physical constant can be an inactive parameter), an impact of changes in the parameter to a quality (e.g., accuracy, precision, compute required, processing speed, etc.) of the model (e.g., parameters with a smaller impact can be inactive parameters, parameters with a larger impact can be active parameters, etc.), a covariance between variables or parameters (e.g., when two parameters have a correlation coefficient greater than about 0.5, 0.6, 0.7, 0.8, 0.9, 0.95, 0.99, values therebetween, etc. at least one of the parameters can be inactive), an error in a variable associated with the parameter, an error or uncertainty in determining the parameter value, and/or can otherwise be identified or selected. Inactive parameters can become active parameters and active parameters can become inactive parameters (e.g., as more data is received; as one or more battery properties change; depending on the current use or application of the model such as for state estimation, for prediction, for safety determination, for anomaly prediction, etc.; depending on the current use of the battery such as charging, discharging, storing, active use, etc.; etc.).

Figure 12:
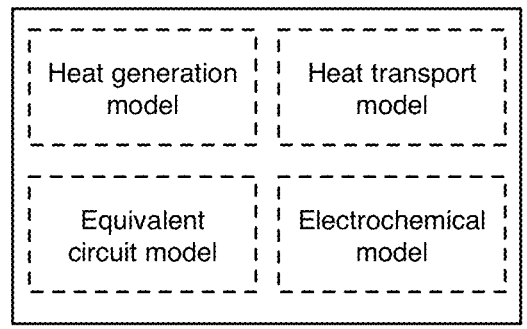
FIG. 12 is a schematic representation of an exemplary battery cell model.
Figure 13:
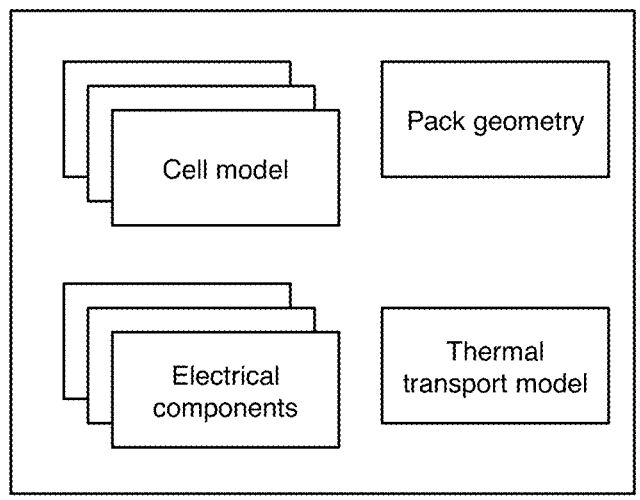
FIG. 13 is a schematic representation of an exemplary battery pack model.

Each model of the set of models is preferably associated with one or more submodels. The submodel(s) are preferably distinct (e.g., covariance between models is low), but can be integrated (e.g., have a non-negligible covariance with other submodels). The submodels can include physical models, nonphysical models, and/or any suitable models. The submodels can include local models (e.g., cell models 144 that are specific to a cell as shown for example in FIG. 12, specific to a module, specific to a predetermined number of cells, specific to an external system, specific to a portion of an external system proximal the battery, etc.), a battery pack model 142 (e.g., including or accounting for each cell of a pack separately or collectively, accounting for each cell in series within a pack, as shown for example in FIG. 13, etc.), a battery module model, an external system model, and/or any suitable models. The submodel(s) are preferably lumped model(s) (e.g., lumped element models), but can be finite element model(s), numerical model(s), continuous model(s), single particle model(s), and/or any suitable model(s). The submodel(s) can include, for example, a thermal model (e.g., a model for determining the thermal distribution within a battery, battery pack, cell, external system, etc.), a heat generation model (e.g., a model for how much heat is generated during operation of the battery), an electrical model, an electrochemical model, a heat transport model (e.g., a model for how heat is transported within and/or between components), a degradation model, an ion transport model (e.g., Li+ transport model), a quantum mechanical model, and/or any suitable models.

Figure 7:
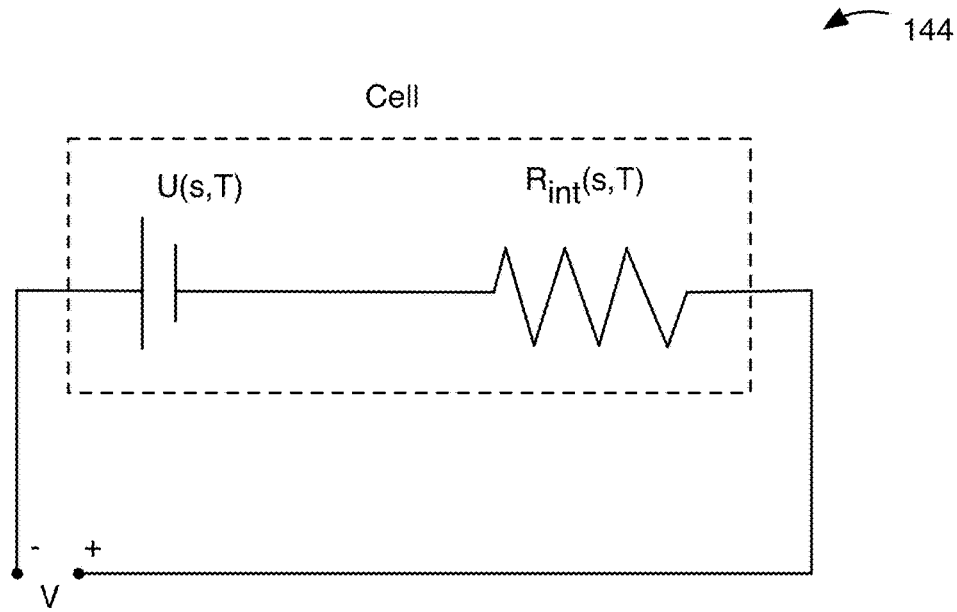
FIG. 7 is a schematic representation of an exemplary battery cell model.
Figure 8:
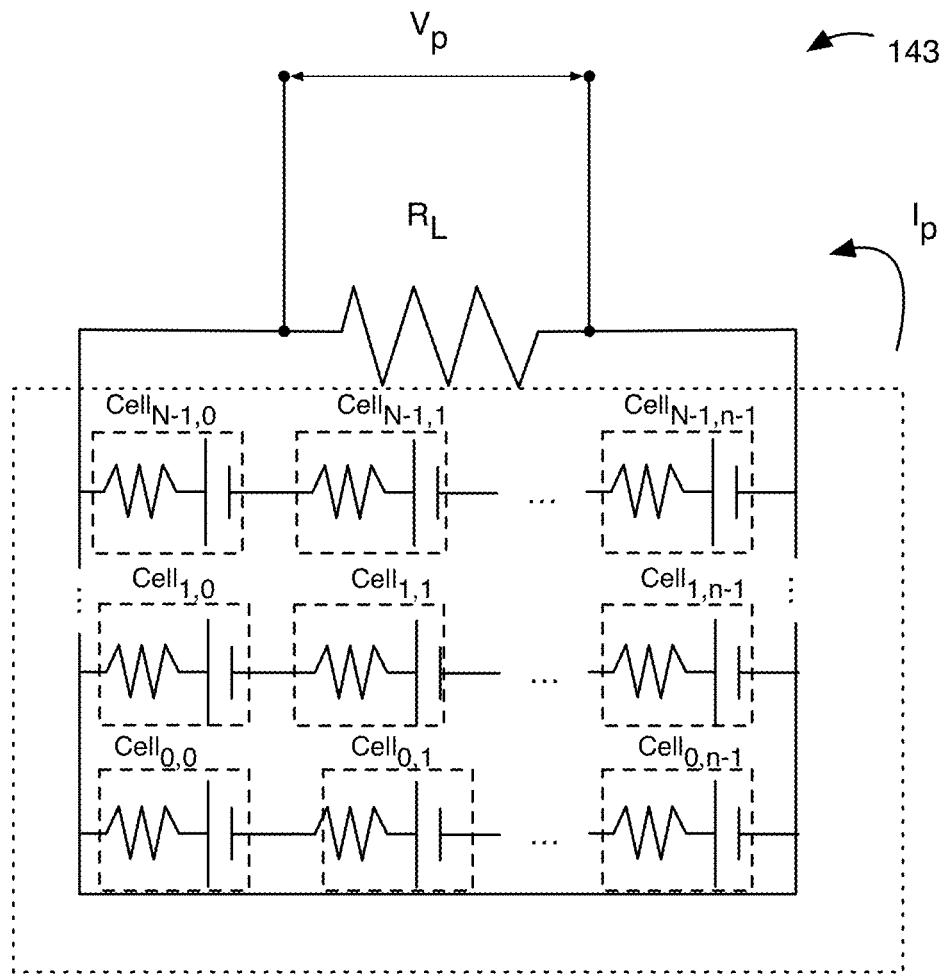
FIG. 8 is a schematic representation of an exemplary battery pack model.
Figure 9:
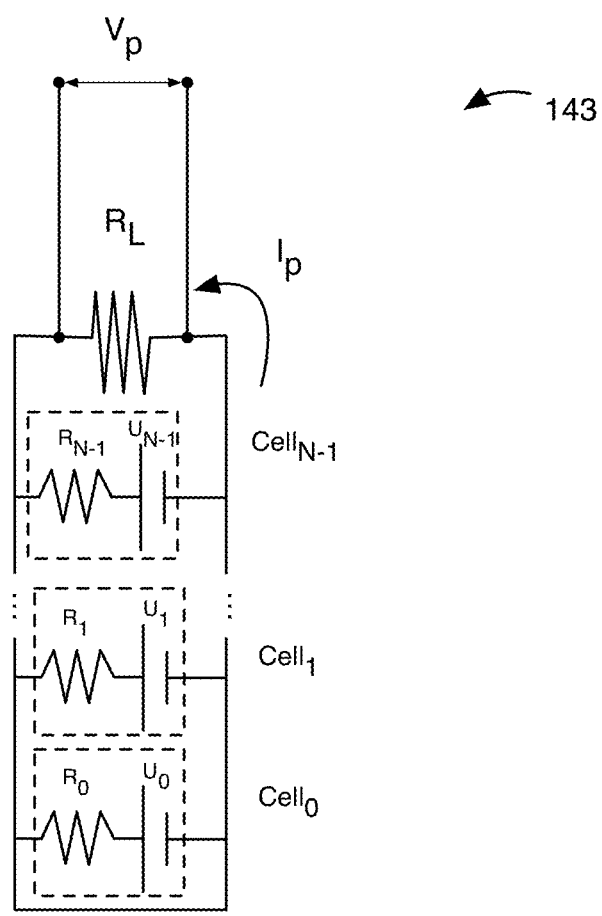
FIG. 9 is a schematic representation of an exemplary battery pack model.

In a first illustrative example, a thermal submodel (e.g., for a temperature distribution within a battery pack or external system) can be represented as: $\dot{T}_i = \Sigma_j M_{i,j} T_j + b_i$, where $\dot{T}_i$ is the change in temperature with respect to time of element i (e.g., where an element can refer to a cell, a group of cells, a cell and nearby thermal mass, a component of a cell, etc.), $M_{i,j}$ is a matrix of interdependencies relating the current temperature distribution to the rate of change of the temperature distribution at each element, $T_j$ is the temperature of element j, and $b_i$ is a source term (e.g., boundary conditions, electrochemical heat generation, external sources, etc.). In a second illustrative example, an electro-thermodynamic heat generation submodel can be represented as:

$$\dot{Q} = \dot{Q}_{irrev} + \dot{Q}_{rev} = I(U - V) - IT\frac{\partial U}{\partial T}\bigg|_q,$$

where $\dot{Q}$ is the change in heat of an element, $\dot{Q}_{irrev}$ can be attributed to a change in heat due to an internal resistor, $\dot{Q}_{rev}$ can be attributed to changes in heat due to reversible processes, I is the element current, U is the element open circuit voltage, V is the potential drop of the element, T is the temperature, and q is the charge. In a third specific example, as shown in FIG. 7, a battery cell can be modeled as a voltage source (e.g., a voltage source with a voltage approximately equal to the open circuit voltage) and a resistor (e.g., with an internal resistance). In a fourth specific example, as shown in FIG. 8, a battery pack can be modelled as a plurality of battery cells, with n cells in series and N cells in parallel. In a fifth illustrative example, as shown in FIG. 9, a battery pack can be modeled as N cells in parallel (e.g., where cells in series can be modeled as a single effective cell). In a sixth illustrative example, an equivalent circuit model can be parameterized by a relationship among information (e.g., temperature, state of charge, age, battery properties, battery states, etc.) pertaining to, associated with, and/or describing a battery. In a seventh illustrative example, an electrochemical model can include and/or be represented by one or more: equivalent circuit models, combinations of equivalent circuit models with electrical components, fully electrochemical models (e.g., single particle models, single particle models with electrolyte, first principles electrochemical models, etc.), integrated electrochemical and thermal models (e.g., tracking temperature and lithium concentration such as in another electrochemical model), and/or any suitable electrochemical models. However, any suitable models can be used.

Each model of the set of models is preferably distinct from other models of the set of models. However, two or more models of the set can be the same. In a first specific example, each model of the set of models can be associated with a different parameterization. In a second specific example, each model of the set of models can be associated with a different set of parameters (e.g., different parameter values, different active and/or inactive parameters, etc.). In a third specific example, different models can include different physical representations of the battery (e.g., one model can include an equivalent circuit representation and another model can include an electrochemical representation). In a fourth specific example, a model can be updated or modified (for example, as more information is available for older batteries, the model can be changed to account for time; as operating regimes or parameters change, the model can be changed; etc.). However, the set of models can include any suitable model(s).

The model from the set of models that is used for a given battery or external system can be manually or automatically determined (e.g., selected). In a first specific example, an operator can choose a model to use (for a given instance or use of the external system, indefinitely, etc.). In a second specific example, a model can be chosen (automatically) based on a battery property or an external system property (e.g., a model can be chosen based on an amount of computation needed to run the model and/or based on an amount of computation available to the computing system). In a third specific example, a model can be chosen based on a threshold or target accuracy of the state estimation or prediction. In a fourth specific example, a model can be chosen based on the application or use case of the battery or external system. However, a model can otherwise be chosen.

The selected model can be updated (e.g., parameters of the model can change, a different model can be selected and replace the previous model, etc.) and/or be fixed. The selected model can be updated, for example, because a new set of models have been generated, a different model is better matched to the current needs of the battery and/or external system, the model is no longer valid or validated, the operator's needs have changed, and/or for any suitable reason. The model is preferably updated smoothly (e.g., without interruptions in the method's performance; without noticeable or perceivable interruptions in the method; with interruptions less than a threshold amount of time such as less than 100 ms, 1 s, 10 s, etc.; during periods of inactivity of the external system and/or battery such as charging a battery with or without drawing energy for other purposes; etc.), but can be choppy, noticeable, and/or otherwise occur. However, the selected model can otherwise be transitioned.

The state estimator 120 functions to estimate a state (e.g., a current state, a future state, etc.) of the external system and/or battery. The state estimator can run on the edge computing system and/or the cloud computing system. In some variants, a first state estimator can be run on the external system and a second state estimator can be run in the remote computing system. In these variants, the first and second state estimator can have the same or different inputs and/or outputs. In these variants, the first and second state estimator preferably, but do not have to, use the same model. The state estimator can be continuous and/or time discrete.

Figure 3A:
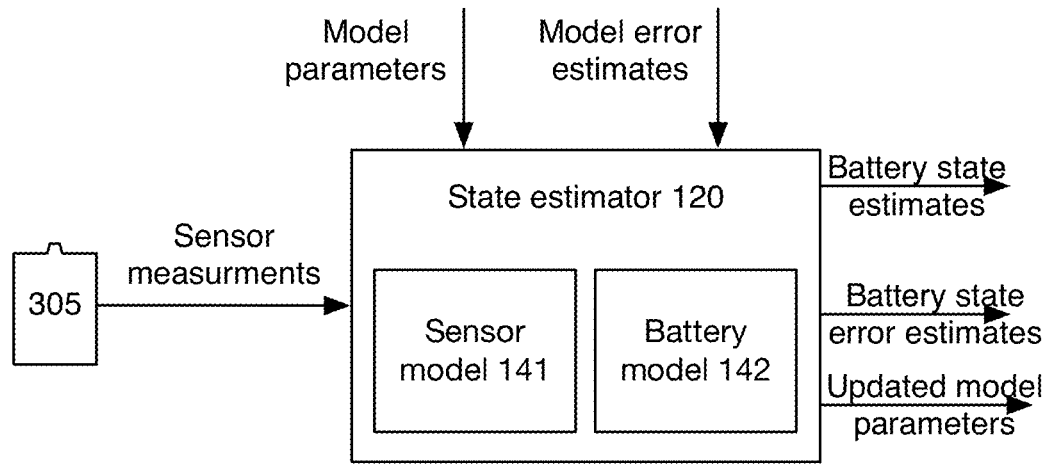
FIGS. 3A and 3B are schematic representations of examples of a state estimator and exemplary inputs and outputs to the state estimators.

As shown for example in FIG. 3A, inputs to the state estimator can include: sensor data, filtered data, battery properties, external system properties (e.g., application, dimensions, geometry, environment, computational power available, duration of service, operator characteristics such as aggressiveness, etc.), a load profile, noise or error in the sensor measurements (e.g., characterization of the sensor noise), noise or error in the external system properties, noise or error in the battery properties, model parameters, model error estimates, and/or any suitable inputs.

The state estimator preferably uses the model (e.g., the selected model) to determine (e.g., predict, calculate, estimate, etc.) the battery state. For example, the model can be used as a state evolution model (e.g., the model can be used to update a set of states such as temperature or state of charge given the current state and one or more inputs) of the state estimator. The state estimator can use a control input model for how a control input impacts or changes a state. For example, a load profile (e.g., predicted load profile, historic load profile, planned load profile, etc.) can be used as a control input vector, where the control input model would model how operating the battery according to the load profile (over time) would change the state of the battery. However, any suitable model(s) can be used.

Outputs (e.g., states) from the state estimator can include: states of the battery system (e.g., predicted state of the battery during or after operating the battery system), battery properties (e.g., true battery properties, denoised battery properties, etc.), states of the external system, covariance between two states, parameters of the model (e.g., active parameters of the model), model error (e.g., estimates of an error in the model parameters), anomaly states (e.g., states that predict or are correlated with a probability of an anomaly occurring during operation of the batter or external system, amount of time before an anomaly would be predicted to occur, etc.), maintenance states (e.g., states that predict or are correlated with a probability of maintenance being needed during operation of the batter or external system, amount of time estimated before maintenance is needed, etc.), time (e.g., lifetime of the battery), and/or any suitable states. Anomaly states are preferably associated with one or more anomalies that can occur to the battery or external system. Anomalies can include: thermal anomalies, electrical anomalies, mechanical anomalies, and/or any suitable anomalies. Exemplary anomalies include: fires, anomalous heat generation, battery failure, lithium plating, battery degradation, and/or any suitable anomalies.

The states can have an absolute value or a relative value. For example, the states can be relative to an initial state (e.g., a battery state associated with a beginning of life of the battery), a recent state (e.g., a battery state at the start of an instance of the method, start of an application or use of the external system, etc.), a final state (e.g., a battery state associated with an end-of-life of the battery), and/or any suitable state.

In some variants, one or more states can be determined and/or identified using machine learning, bootstrapped datasets, and/or otherwise be determined. The training dataset used to identify the states can include: characterization data, field data (e.g., battery properties for batteries operating in the field), simulation data, and/or any suitable data. The training data can be weighted (e.g., batteries that have experienced an anomaly or other rare event can have a larger weight than other batteries, simulations that exhibit an anomaly can have larger weights, etc.) or unweighted. For example, a set of simulations (e.g., performed using the model in the simulation engine) can be performed where in the simulation an anomaly occurs and/or maintenance is necessary. Machine learning (or other techniques) can be used to identify a state that is predictive of the occurrence of a rare event (e.g., an anomaly, maintenance, insurance claim, change in warranty status, etc.), where the state estimator can generate said state. However, the states can be determined based on stress-testing of batteries (e.g., operating the batteries outside of normal operation conditions and characterizing the response or behavior of the batteries), based on a rare occurrence of events, based on predicted states of relevance, and/or in any suitable manner.

The state estimator can include: a Kalman filter, an extended Kalman filter, an unscented Kalman filter, an ensemble Kalman filter, a look-up table, a Markov Chain Monte Carlo technique, linearization techniques, machine learning techniques (e.g., a neural network), and/or any suitable particle filter, sequential Monte Carlo technique, or other state estimator. The state estimator (e.g., type, where the state estimator runs, etc.) can depend on an accuracy of the estimated state, an amount of processing power available, and/or otherwise depend on any suitable properties.

In variants of the state estimator including a look-up table, the look-up table can include a relationship between a set of battery properties (e.g., measured battery properties) and a set of model parameters. For example, the model parameters can be parameters for a Kalman filter where the Kalman filter is used to estimate the battery state. This can provide the benefit of operating efficiently in computationally constrained environments (such as on an edge computing system). Within the look-up table, different model parameters can be associated with different regimes of battery properties. For example, a first set of model parameters can be associated with a first temperature range, a second set of model parameters can be associated with a second temperature range, and so on. Each range or regime is preferably approximated as a linear function, but can be approximated by any suitable function. The range or regime being approximated by a linear function can be beneficial for both computational speed and efficiency as well as enabling or supporting deterministic battery state determination (e.g., for the same inputs, the same outputs will be produced) and/or provide any suitable benefit. The number of regimes (and/or number of variables divided over the regimes) can be set by a processing power of the computing system, by a transmission bandwidth, by an accuracy of the approximation (e.g., a linear approximation) of the regimes, sampling rates, by an accuracy of the output battery states, and/or based on any suitable information.

Figure 3B:
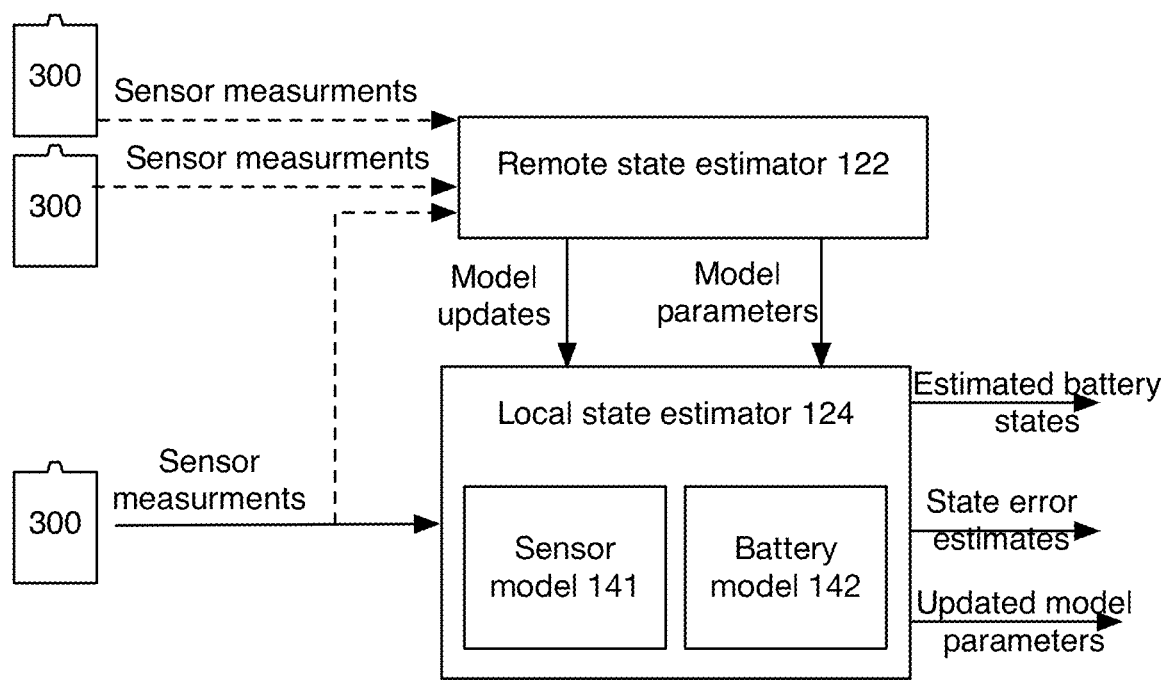
Figure 16:
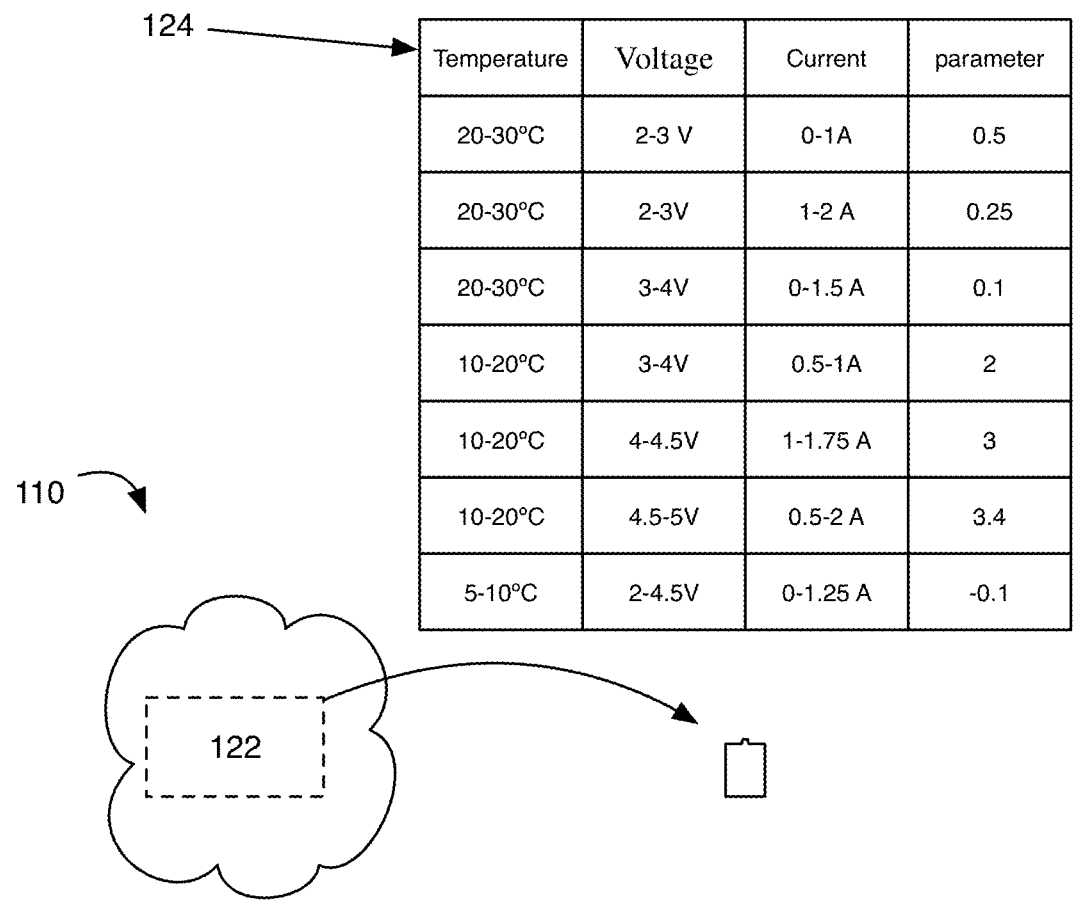
FIG. 16 is a schematic representation of an example of a state estimator being used to generate a look-up table for a local state estimator.

In some embodiments, as shown for example in FIGS. 3B and 16, the system can include more than one state estimator. The state estimators preferably run on different computing systems, but can be used on the same computing system. Each state estimator can be the same (e.g., same type of state estimator) or different. The state estimators can be chosen based on a state accuracy, a processing power (e.g., available at the computing system running the state estimator), a validity of the state estimator, and/or otherwise be chosen.

Each state estimator (associated with a given fleet or battery) preferably uses the same model, but the state estimators can use different models. Each state estimator can use the same or different inputs. For example, one state estimator can use a subset of the inputs or sensor data used by a second state estimator. Each state estimator can output the same or different outputs.

In a first illustrative example of a system using a plurality of state estimators, a first state estimator 124 can be integrated into an external system and/or battery computing system and a second state estimator 122 can be integrated into a cloud computing system. In this specific example, outputs (e.g., estimated states) from the first state estimator can include a first set of model parameters (e.g., first set of active model parameters) and outputs from the second state estimator can include a second set of model parameters (e.g., a second set of active model parameters). The first and second set of model parameters can be the same and/or different model parameters. Typically, the first set of model parameters is a subset of the second set of model parameters (i.e., the second set includes most or all of the model parameters in the first set as well as additional model parameters). However, the first and second set of model parameters can include any suitable parameters. In this specific example, inputs to the first state estimator are typically battery properties for a battery associated with the first state estimator. Inputs to the second state estimator can include battery properties for batteries associated with a fleet or group of batteries (e.g., in addition to the battery associated with the first state estimator) and/or characterization batteries. In this example, both state estimators can be unscented Kalman filters.

In variations of the first example, the first state estimator can be run and or used at a first time scale and the second state estimator can be run and/or used on a second time scale. The first time scale is generally shorter than the second time scale, which can be referred to as a "fast model" and a "slow model" respectively. For instance, the first time scale can be between about 1 second and 1 day (e.g., 1 s, 2 s, 5 s, 10 s, 20 s, 30 s, 1 min, 2 min, 5 min, 10 min, 20 min, 30 min, 1 hr, 2 hr, 4 hr, 6 hr, 8 hr, 12 hr, 18 hr, 24 hr, values therebetween) and the second time scale can be between about 1 day and 1 year (e.g., 1 day, 2 days, 3 days, 5 days, 1 week, 2 weeks, 3 week, 4 weeks, 1 month, 2 months, 3 months, 4 months, 6 months, 8 months, 9 months, 12 months, values therebetween). However, the first and second time scales can be any suitable amount of time.

In a second specific example as shown in FIG. 16, a first state estimator operating on a first computing system (e.g., a cloud server) can be used to generate a second state estimator that is to be used on a second computing system (e.g., battery computing system, external system computing system, edge computing system, etc.). In this example, the first state estimator can be an unscented Kalman filter and the second state estimator can include a look-up table that is used to determine the model parameters for a Kalman filter. However, any suitable state estimators can be used. The second state estimator can be validated by the first state estimator (e.g., a validation of the second state estimator can be associated with a state output by the first state estimator), be conferred from the first state estimator (e.g., when the first state estimator is validated), be validated such as by a validation engine, and/or can otherwise be validated.

The simulation engine 130 functions to perform a simulation to predict a state of a battery system. The simulation engine (e.g., outputs thereof) can be used to validate the model, validate the state estimator, predict a state of the battery after operating the battery according to a load profile, be used to inform, determine, and/or identify one or more states to be determined by the state estimator, and/or can otherwise be used. The simulation engine typically runs on a remote computing system, but can run on a local computing system. The difference between the simulation engine and the state estimator is that the state engine processes measurements of the battery properties (e.g., in real time, in near-real time, delayed processing, etc.) whereas the simulation engine typically processes (e.g., uses as an input) a digitally generated starting point. The digitally generated starting point can be derived from or based on a measured battery property or a prior state of the battery, but typically does not update as the battery properties change (as it would then be a different simulation). Error in the battery property can grow within the simulation according to a characterized error function (e.g., associated with an error in the sensor measurements). However, the simulation can include measured battery properties and/or otherwise be defined.

Inputs to the simulation can include: inputs to the state estimator, a load profile (e.g., charging and discharging profiles for the battery), a starting state (e.g., SoC, SoH, DoD, etc.), operating condition scenarios (e.g., normal, abnormal, etc.), and/or any suitable information. The starting state is preferably determined from a battery system state, but can be randomly or pseudorandomly generated, be determined from a previous simulation, and/or otherwise be determined. The inputs can be automatically or manually determined. For example, a load profile can be determined or derived from a map path (e.g., topology, distance, road condition, average speed, instantaneous speed profile, etc.) that the external system is expected or intended to traverse. In another example, a load profile can be determined or derived from measured or predicted (e.g., accesses from an almanac, internet platform, etc.) weather patterns (e.g., wind speed, wind direction, rain, sun, etc.). However, the inputs can otherwise be generated.

The simulation engine can perform Monte Carlo simulations, numerical modelling, numerical integration, a deterministic method, Latin Hypercube Sampling, variational techniques, finite difference methods, and/or can implement any suitable techniques or methods.

The simulation engine preferably uses the model (e.g., selected model) from the model generator. However, the simulation engine can use any suitable model. The simulation engine and state estimator preferably use the same model, but can use different models.

Outputs from the simulation can include any state (e.g., output of the state estimator), and/or any suitable outputs. For example, a simulation can output a predicted state of a battery system given an initial state, when the battery is operated according to a given load profile.

In some embodiments, the simulation engine can be used to explore the available state space of possible battery states (particularly but not exclusively to explore states that would not be safe to achieve in a laboratory, testing facility, and/or field setting). These variants can be beneficial for generating training data for determining or improving a model or state estimator for predicting when anomalies can occur, when maintenance is needed, when a warranty may be voided, and/or provide benefits to other circumstances.

The validation engine 150 preferably functions to validate the model and/or the state estimator, but can additionally or alternatively validate inputs, measured data, the simulation engine, and/or any suitable data or information. The model and the state estimator are preferably each validated. However, only the model can be validated, only the state estimator can be validated, neither the model nor the state estimator can be validated, and/or any suitable data or information can be validated. The model and/or state estimator can be valid for a time span (e.g., a predetermined amount of time, for as long as a validation criterion is satisfied, etc.), indefinitely, and/or for any amount of time. The validation engine can validate the model and/or state estimator once; at predetermined times; at a predetermined frequency; in response to a change or update to the model, state estimator, battery, and/or other component; in response to a request from an operator; in response to a request from a regulatory body or agency; randomly or pseudo-randomly; and/or at any time.

The validation engine can receive (and/or use for validation): measured data (e.g., from sensors), simulated states (e.g., from a simulation engine; simulated for previous states of the battery, simulated for a current battery state, simulated for future battery states, etc.), estimated states (e.g., from a state estimator; estimated for previous states of the battery, estimated for a current state of the battery, estimated for a future state of the battery, etc.), noise (e.g., measurement noise), covariances (e.g., between states, between parameters, etc.), and/or any suitable data or information.

The model and/or state estimator can be validated when a validation criteria is satisfied. Exemplary validation criteria include: accuracy (e.g., model accuracy, state accuracy, a threshold number of batteries or battery states having a target accuracy, etc.), precision (e.g., a threshold number of batteries or battery states having a target precision), a difference between a simulated state and a measured state, a correlation between a simulated state and a measured state, a difference between an estimated state and a measured state, a correlation between an estimated state and a measured state, and a difference between an estimated state and a simulated state, a correlation between an estimated state and a simulated state, and/or any suitable validation criterion.

Figure 14A:
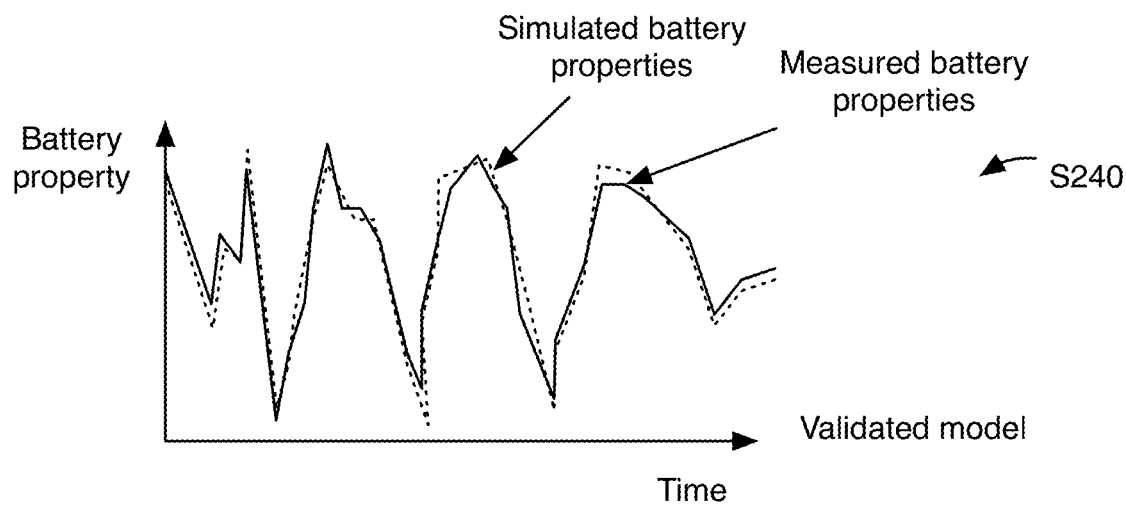
FIGS. 14A and 14B are schematic representations of examples of a validated and not validated model, respectively.
Figure 14B:
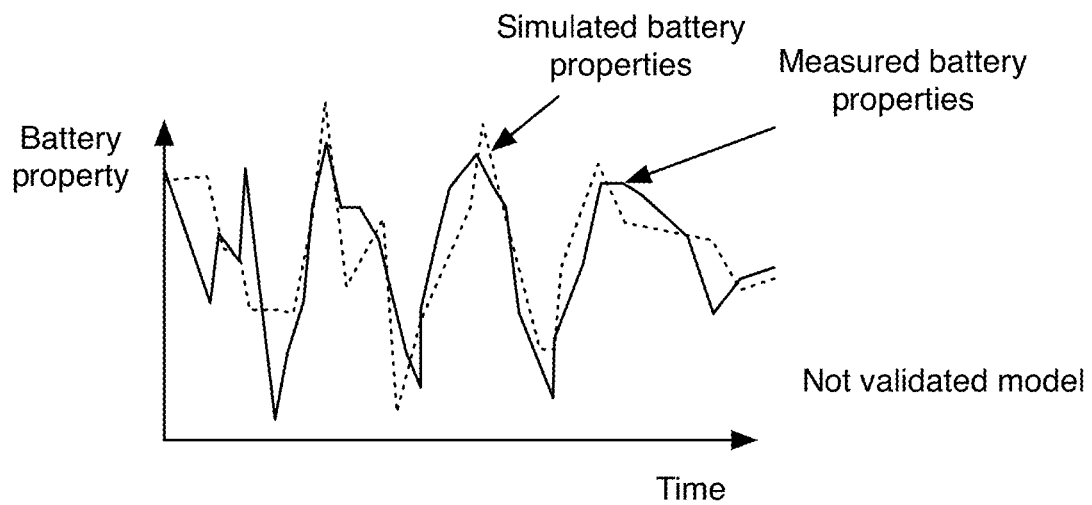
Figure 15:
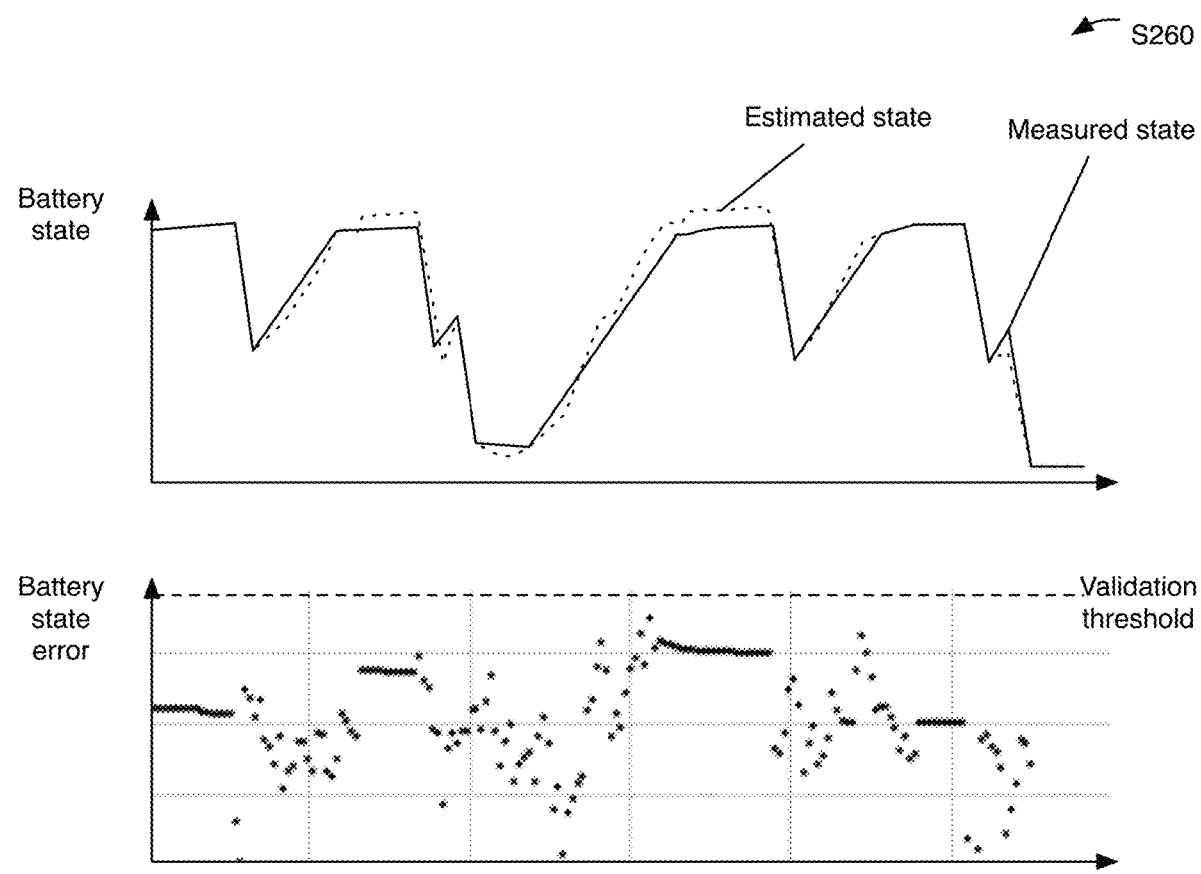
FIG. 15 is a schematic representation of an example of a validated state estimator.

In a first illustrative example as shown for example in FIG. 14A, a model can be validated based on a comparison between historical states (e.g., measured states) of a battery and a simulation performed with a similar (e.g., the same) starting point and responsive to the same load. Conversely, as shown for example in FIG. 14B, a model can not be validated (or be invalidated) based on a comparison between historical states of a battery and a simulation when the historical states and the simulation do not match (e.g., differ by greater than a threshold amount). In a second illustrative example, a model can be validated when simulated states for a threshold number of characterized batteries match (e.g., within a threshold, average difference less than a threshold, maximum difference less than a threshold, etc.) the historical states for analogous batteries. In a third specific example, a state estimator can be validated when simulated states and estimated states (e.g., estimated by propagating the current state forward in time using the state estimator) match (e.g., within a threshold, average difference less than a threshold, maximum difference less than a threshold, etc.). In a fourth illustrative example as shown in FIG. 15, a state estimator can be validated by comparing an estimated state and a measured state for one or more battery (e.g., validating the state estimator when the measured and estimated states match within a threshold, an average difference is less than a threshold, a maximum difference is less than a threshold, etc.). In a fifth illustrative example, a first (validated) state estimator can be used to validate a second state estimator. In a first variation, the second state estimator can be derived from or developed using the first state estimator, where the determination of the second state estimator can be such that the second state estimator retains a validity from the first state estimator. In a second variation, the states estimated by the first and second state estimator can be compared and when the two estimated states match, the second state estimator can be validated. However, the model and/or state estimator can otherwise be validated.

The validation engine can be hosted by a remote computing system (e.g., cloud computing system, an edge computing system, distributed between an edge and a remote computing system, and/or otherwise be distributed between any suitable computing systems.

The communication module(s) 160 function to enable or facilitate communication between two or more system components (e.g., sensors, batteries, computing systems, modules of the computing systems, etc.). The communications modules can be wired or wireless. The communication modules can include long-range communication modules (e.g., supporting long-range wireless protocols), short-range communication modules (e.g., supporting short-range wireless protocols), and/or any other suitable communication modules. Exemplary communication modules include: cellular radios (e.g., broadband cellular network radios) such as radios operable to communicate using 3G, 4G, and/or 5G technology; Wi-Fi radios; Bluetooth (e.g., BTLE) radios; NFC modules (e.g., active NFC, passive NFC); Zigbee radios; Z-wave radios; thread radios; wired communication modules (e.g., wired interfaces such as USB interfaces); satellite radios; and/or any other suitable communication modules.

4. Method.

The method can function to determine (e.g., estimate, predict, simulate, etc.) a battery state (e.g., during and/or as a result of operating the battery according to a load profile), generate (and/or update) one or more models for determining the battery state, select a model from the one or more models to use, validate the model(s) and/or a state estimator, predict an occurrence of an anomaly, and/or can otherwise function. The method is preferably performed using a system as described above; however, the method can additionally or alternatively be performed using a battery management system and/or any suitable system.

The method and/or steps thereof can be performed in real- or near-real time (e.g., during operation of an external system and/or battery), prior to operation of an external system and/or battery (e.g., immediately prior, with a time delay, etc.), and/or can be performed after operation of the external system or battery. The method and/or steps thereof can be performed automatically and/or manually. Multiple instances of the method can be performed simultaneously or contemporaneously (e.g., in parallel) and/or sequentially.

Figure 10A:
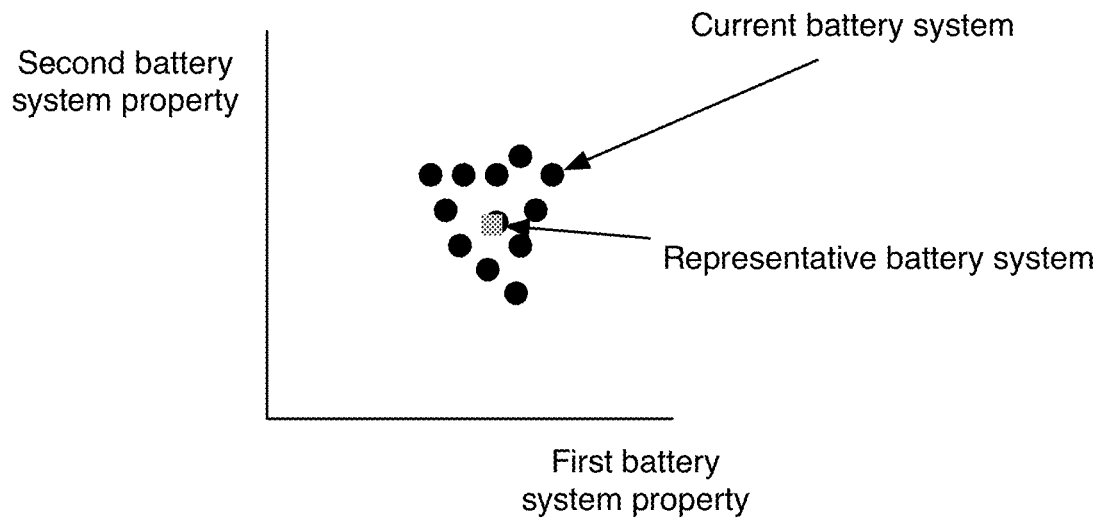
FIGS. 10A and 10B are schematic representations of examples of clustering battery systems within a fleet of battery systems.
Figure 10B:
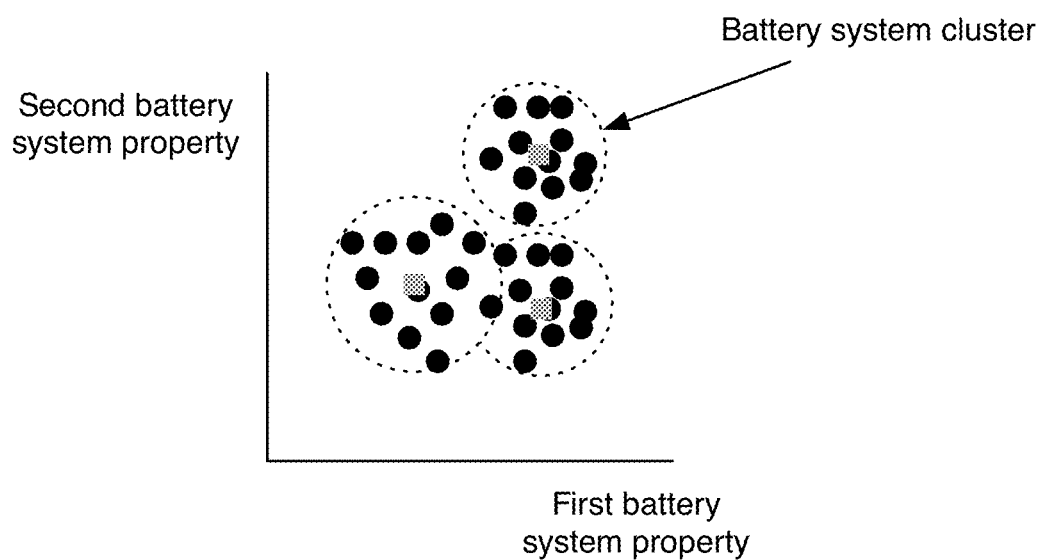

The method and/or steps thereof can be performed for every external system of a fleet of external systems, for a subset of systems of the fleet (e.g., a medoid of one or more clusters of systems within the fleet), for one or more hypothetical battery systems (e.g., for artificial battery systems with parameters that are representative of a plurality of battery systems of the fleet, as shown for example in FIGS. 10A and 10B, etc.), for test battery systems (e.g., to simulate what would happen for a battery with a predetermined set of properties), and/or for any suitable battery system(s). When performed for a plurality of managed systems, the method and/or steps thereof can be performed simultaneously, contemporaneously, iteratively (such as to update one or more parameters, weights, operation properties, predictions, etc. based on the feedback from estimates of other members of the fleet), sequentially, and/or with any suitable timing. When the method and/or steps thereof are performed for a plurality of battery systems, the method and/or steps thereof can be performed in the same or different manners for each managed system.

In an illustrative example, the method and/or steps thereof can be performed for a hypothetical managed system that has typical properties (e.g., 50% percentile for one or more properties, average properties, median properties, modal properties, etc. for the fleet and/or for a cluster of managed systems; properties associated with a centroid of a cluster of managed systems; etc.). In a second illustrative example, the method and/or steps thereof can be performed for a hypothetical managed system with a predetermined set of properties (e.g., one or more properties at the $1^{st}$, $2^{nd}$, $5^{th}$, $10^{th}$, $20^{th}$, $30^{th}$, $40^{th}$, $50^{th}$, $60^{th}$, $70^{th}$, $80^{th}$, $90^{th}$, $95^{th}$, $98^{th}$, $99^{th}$, etc. percentile for the fleet and/or for a cluster of managed systems). In a third illustrative example, the method and/or steps thereof can be performed using (measured or determined) properties for a managed system (with or without creating a buffer around the values). In variations, the method and/or steps thereof can be performed for multiple managed systems where the results for one managed system can impact, change, and/or otherwise be used to inform the results for another managed system.

The method and/or steps thereof can be performed at a predetermined frequency, with predetermined timing, responsive to an input or request for method operation, responsive to a trigger (e.g., change in the number of systems in a fleet, change in a state or average state of systems in the fleet, operator or user request for estimate, etc.), randomly, and/or be performed with any timing. The method and/or steps thereof can be performed with any suitable frequency. For example, the method and/or steps thereof can be performed one or more times a day (e.g., 1, 2, 4, 10, 20, 40, 100, 200, 400, 1000, 2000, 4000, 10000, 20000, 40000, >40000, values therebetween, etc. times per day), one or more times a week, one or more times a month, one or more times a year, one or more times a decade, and/or with any suitable frequency.

Data and/or information used by the method and/or steps thereof can be accessed from and/or the method and/or steps thereof can be implemented using an application program interface (API), a user interface, an external system interface, a callback (e.g., a webhook, a programmatic callback, etc.), a communication session, an application (e.g., a web application), a dashboard, and/or any suitable interface can be used. Exemplary APIs that can be used include: RESTful APIs, HTTP-based APIs, and application layer APIs, and/or any suitable API.

The method can include: characterizing one or more batteries S100, generating one or more models S200, receiving battery measurements S300, determining battery state(s) S400, updating the model(s) S500, transmitting the state(s) S600, and/or any suitable steps.

Characterizing one or more batteries S100 functions to generate characterization data that can be used to generate one or more models (e.g., by measuring how battery properties are related to one another, by measuring how battery properties change with time, etc.). S100 is preferably performed in a controlled setting (e.g., a characterization facility, a laboratory, etc.), but can be performed in an uncontrolled or poorly controlled setting (e.g., in the field, during battery operation, during external system operation, etc.). In a specific example of battery characterization in a poorly- or uncontrolled setting, a battery can be characterized while the battery is connected to a charger (e.g., in a manner as described below). S100 can be performed automatically and/or manually. The batteries of the characterization set are preferably substantially identical to (e.g., indistinguishable, manufactured in the same facility, manufactured at about the same time, manufactured to meet the same specifications, etc.) batteries of external systems (e.g., operating in the field). However, one or more characterization batteries can be distinct from the batteries in use in the field (e.g., to test an impact or improvement to a different battery design). The batteries of the characterization data set are preferably nondestructively characterized. However, one or more batteries can be destructively characterized (e.g., subjected to extreme loads; subjected to extreme conditions such as heat; punctured; etc.).

Characterizing one or more batteries S100 can additionally or alternatively function to generate characterization data for one or more sensor associated with the batteries. For example sensor error and/or bias can be characterized. However, any suitable battery or component properties can be characterized.

The characterization dataset preferably includes battery properties associated with a plurality of batteries (e.g., 2, 3, 4, 5, 10, 20, 30, 40, 50, 100, 200, 400, 1000, values therebetween, more than 1000 batteries, etc.). However, the characterization dataset can include battery properties associated with a single battery, and/or any suitable number of batteries. The battery properties can be characterized using integrated sensors (e.g., a battery management system of the battery), dedicated sensors, external sensors, be inferred from measurements, characterization hardware 210, and/or can otherwise be characterized. The battery properties are preferably measured at the same rate as battery property measurements are made during battery operation (e.g., outside of characterization). However, the battery properties can be measured at a higher rate (e.g., to generate a more complete dataset), at a lower rate, at a variable rate, and/or at a rate that is not related to the battery property measurement rate during battery operation.

In some embodiments, a plurality of characterization datasets can be generated (e.g., received, measured, etc.). Each characterization dataset can be associated with the same characterization batteries (e.g., characterized according to different battery profiles) or different characterization batteries (e.g., different battery types, different battery manufacturers, different battery properties, etc.). The plurality of characterization datasets can be combined to form a single characterization dataset (e.g., for use in generating a model such as in S200) and/or the plurality of characterization datasets can be distinct or separate (e.g., each characterization dataset can be used to generate a separate set of models such as in S200). However, the plurality of characterization datasets can otherwise be used and/or generated.

The characterization dataset preferably includes battery properties over a time span. The time span is preferably at least a month (e.g., 1 month, 6 weeks, 2 months, 3 months, 4 months, 6 months, 9 months, 12 months, 1.5 years, 2 years, values therebetween, greater than 2 years, etc.), but can be less than a month (e.g., 1 hour, 1 day, 3 days, 5 days, 1 week, 2 weeks, 3 weeks, 4 weeks, 1 month, values therebetween, less than 1 hour, etc.). The characterization dataset preferably includes information regarding the battery properties for every characterized battery property over the time span; however, a subset of characterized battery properties can be measured at different rates (e.g., leading to complete characterization for a subset of characterized battery properties). The characterized battery properties can include all battery properties and/or any subset of battery properties. In a specific example, the open circuit voltage, battery temperature, internal resistance (e.g., ohmic resistance, concentration resistance, etc.), state of charge, current, instantaneous voltage, and/or entropic coefficient can be characterized. However, any suitable battery properties can be characterized.

S100 can include: determining characterization profiles, applying the characterization profiles, and measuring battery properties. However, S100 can include any suitable steps.

Determining characterization profiles preferably includes identifying or selecting loads to apply to the batteries during characterization. The characterization profiles preferably refer to a set of conditions that the characterization batteries are subjected to, but can otherwise be defined. In general, the characterization profiles can include charging and discharging of the batteries. However, the characterization profiles can additionally or alternatively include only battery charging, only battery discharging, open circuit conditions, and/or to any suitable condition(s). The characterization profiles are preferably associated with (e.g., derived from) operating conditions of the battery and/or external system. The operating conditions can include: normal operating conditions (e.g., average operating conditions, typical operating conditions, preferred operating conditions, etc.), extreme operating conditions (e.g., specification limits, preferred operation limits, limits accounting for rare or exceptional circumstances, etc.), extend beyond extreme operating conditions (e.g., to characterize the battery response outside the operating conditions), and/or be any suitable operating conditions. However, the characterization profiles can be independent of the operating conditions, and/or otherwise be related to the operating conditions. As an illustrative example, characterized batteries can be operated over a range of states of charge greater than the range of states of charge that are expected during the operation of the battery. For instance, if the normal operating range for the battery is expected to be between 40-60% state of charge (where the state of charge can be the initial state of charge of the battery, a current state of charge of the battery, an end-of-life state of charge, etc.), one or more batteries can be characterized over a state of charge between 0-100% (or limited ranges contained therein such as 20-90%, 40-80%, 20-80%, 40-90%, 40-100%, 20-100%, 10-100%, 40-60%, etc.). In some variations, the characterization load can include microcycling (e.g., cycling the battery over a narrow range of charges and discharges such as ±0.1%, ±0.5%, ±1%, ±2%, ±5%, ±10%, etc.; over a narrow voltage range such as ±0.01V, ±0.02V, ±0.05V, ±0.1V, +0.2V, ±0.5V, ±1V, etc.; over a narrow current range; etc.), which can function to quickly characterize a battery within the range of battery properties and/or enable high quality data is available for the battery property ranges.

The characterization profiles can include (e.g., set or measure battery properties as a function of or in response to): an amount of energy to release or store, an amount of charge to charge or discharge, a rate of change for the energy or charge, higher order derivatives (with respect to time) of the energy and/or charge, a duration of applying characterization profiles, an environmental temperature of the battery and/or external system, an environmental humidity proximal the battery (and/or external system), environmental pressure (e.g., vacuum, atmospheric pressure, pressure less than atmospheric pressure, pressure greater than atmospheric pressure, etc.), mechanical conditions (e.g., shock, vibrations, etc.), and/or any suitable conditions.

The conditions of the characterization profile can be periodic, aperiodic, quasiperiodic, constant, and/or have any suitable periodicity. Exemplary periodic characterization profiles (particularly but not exclusively relating to charging and/or discharging) can include: triangle pulses, sinusoidal pulses (e.g., sine, cosine, cas, cis, versine, vercosine, coversine, covercosine, haversine, havercosine, hacoversine, hacovercosine, magnitude of sine, tangent, cotangent, secant, cosecant, etc.), sawtooth pulses, square pulses, cycloid pulses, trochoid pulses, elliptic functions, and/or any suitable profiles.

The characterization profiles can be chirped profiles (e.g., a superposition of two or more profiles occurring contemporaneously, simultaneously, within a predetermined time window, etc.), nonchirped, burst profiles, continuous profiles, and/or any suitable profiles. Using chirped characterization profiles can speed-up the rate of characterization acquisition (e.g., enable a larger span of the battery properties to be measured in a given time relative to using non chirped profiles). The chirp can be a linear chirp, nonlinear chirp (e.g., sinusoidal, polynomial, exponential, etc.), and/or any suitable chirp. In some variants, the characterization profiles can be amplitude modulated (e.g., in addition to or alternative to the frequency and/or phase modulated chirped profile).

In some embodiments, the characterization profile can be informed by (e.g., selected based on, updated based on, etc.) battery properties measured or estimated for batteries operating in the field (e.g., batteries that are not included in the characterization batteries) and/or model updates (e.g., as described in S500). In these embodiments, the characterization profile can be informed (e.g., chosen, updated, etc.) using machine learning (e.g., a neural network), a gradient-descent approach, simulated annealing, a Gaussian process model, stochastic gradient descent, nonlinear conjugate gradient, Levenburg-Marquette algorithm, and/or any suitable technique. In these embodiments, the characterization profile can be updated (e.g., optimized) based on: a characterization time (e.g., amount of time necessary to characterize the batteries according to the characterization profile, amount of time to generate a model, etc.), model training time, a model parameter variance, a model error, model update time, and/or any suitable information. The informed characterization profile can have an improved range of test values within the profile, change the conditions that the battery is exposed to, change the chirp (e.g., characterization profile duration, change the pulse shape, change a modulation, etc.), change the battery measurements, and/or otherwise change or modify the properties of the characterization profile. In an illustrative example, when operated batteries (e.g., states estimated for operated batteries) show limited response to a change in temperature, temperature can be deprioritized as a variable during characterization. In a related example, as batteries age the characterization profile can be modified to inform characterization of specific aspects of the aging battery.

Each battery of the plurality of characterized batteries can be characterized in the same manner or different manners. For example, two batteries can be characterized according to out of phase characterization profiles. In a second example, each battery can be characterized with a different phase for the characterization profiles. In a third example, each battery can be characterized over a different range of battery properties. For instance, a first battery can be characterized over a range of state of charges between about 40-60%, a second battery can be characterized over a range of state of charges between about 30-70%, and so on. In a fourth specific example, each or a set of characterization batteries can be operated according to the same or similar characterization profiles at the same or different environmental conditions (e.g., temperature, pressure, humidity, illuminance, etc.). However, the plurality of characterized batteries can be characterized according to any suitable characterization profile(s).

Applying the characterization profiles preferably functions to subject the batteries of the characterization batteries to a characterization profile. The characterization profiles can be applied automatically (e.g., using robotics to connect the battery to a circuit, applying the characterization profile to the battery, etc.) and/or manually. Applying the characterization profiles preferably includes connecting the batteries to a circuit (e.g., including a sensor, load, power source, etc.) and charging (or discharging) the battery according to the characterization profile.

In some variants, applying the characterization profiles can include holding one or more conditions substantially constant (e.g., varying by less than about 0.1%, 0.5%, 1%, 5%, 10%, etc.). In these variants, the conditions can actively or passively be held constant. For example, a sous vide (e.g., a thermal bath, a temperature regulation loop, etc.) can be used to decrease (e.g., minimize) the variation of a temperature of the battery during characterization. In a second example, the batteries can be characterized within a chamber with controlled environmental conditions (e.g., lighting, humidity, pressure, etc.). However, the conditions can be uncontrolled (e.g., allowed to vary naturally, forcibly changed, etc.) and/or be controlled in any manner.

Measuring the battery properties functions to determine the battery properties for the characterization batteries. The characterization battery properties can be measured before, during, and/or after applying the characterization profile conditions. The battery properties can be measured using sensors (e.g., battery management systems), test equipment, and/or using any suitable system. The battery properties can be measured at a frequency between about 1 Hz and 1000 Hz. However, the battery properties can be measured at a frequency less than 1 Hz or greater than 1000 Hz. Examples of testing equipment include: electrochemical impedance spectroscopy (EIS), galvanostatic intermittent titrators, calorimeters, hydrometers, sensors, and/or any suitable test equipment.

In a first illustrative example, EIS can be used to characterize an internal temperature of the battery. In a second illustrative example, EIS can be used to characterize entropic heating of the battery. In a third illustrative example, galvanostatic intermittent titration techniques can be used to characterize a battery resistance (e.g., ohmic resistance) and/or a diffusion coefficient.

In variants, measuring battery properties can include determining battery properties that are static (e.g., invariant and/or substantially invariant over time). Static battery properties can be measured by inspection (e.g., taking apart a battery pack), by performing physical modeling of the battery, by single time point measurements of the battery, using characterization profiles, from a manufacturer or operator specification sheet, using one or more sensors to characterize the battery, determining the battery properties based on the battery response to the characterization profile, and/or otherwise determining static battery properties. As an illustrative example, a cell thermal mass can be measured using calorimetry. However, any suitable battery property can be measured in any suitable manner.

In some embodiments, characterizing one or more batteries can include performing anomaly characterization for one or more batteries. Anomaly characterization can include operating the batteries in conditions expected or predicted to cause or lead to an anomaly, operating the battery(s) in atypical conditions (e.g., with anode, cathode, and/or electrolyte exposed to an external environment), and/or other suitable conditions. For example, swelling experiments and/or electrode fracture experiments can be performed.

Figure 4:
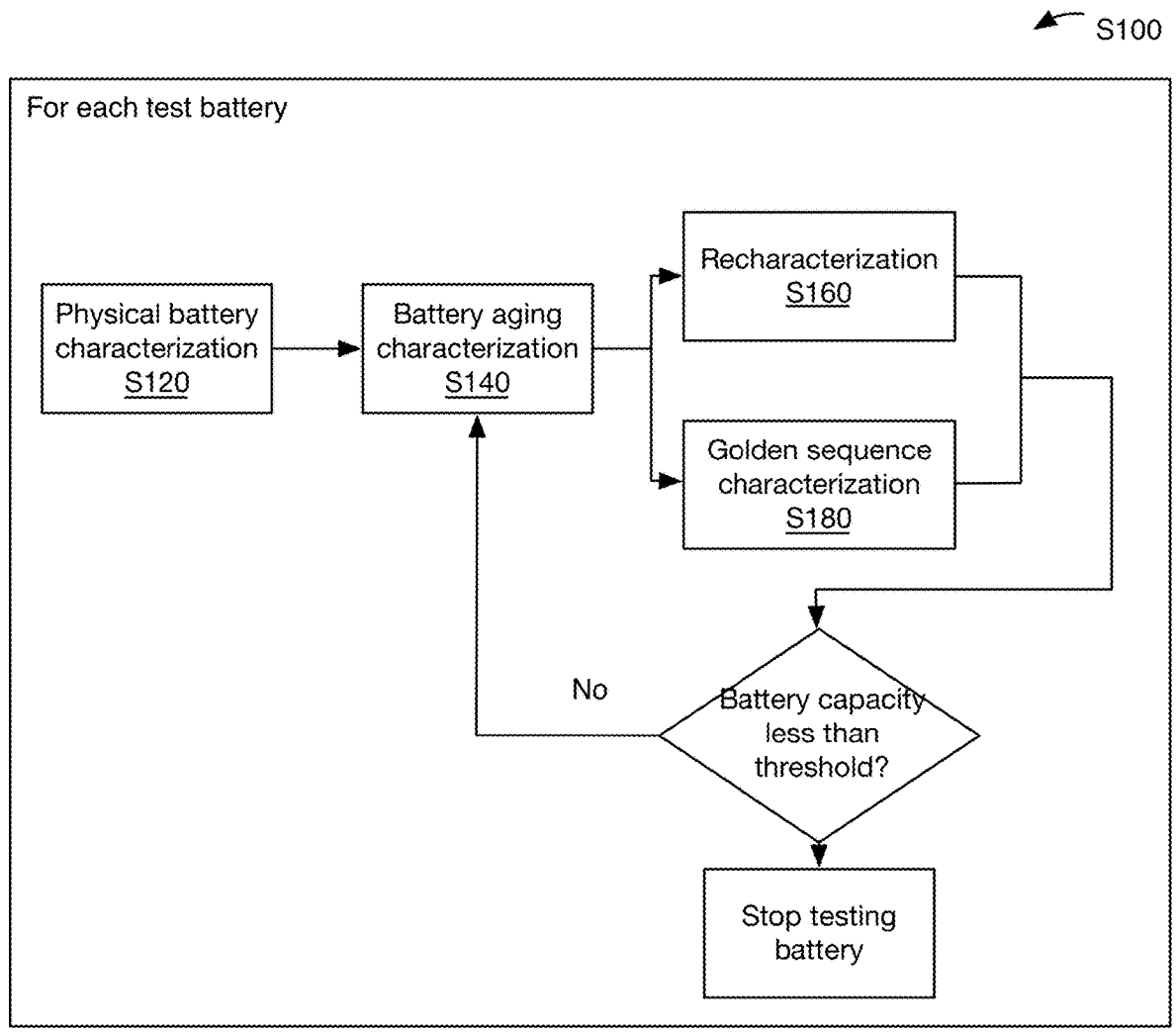
FIG. 4 is a schematic representation of an example of characterizing a battery.

In some embodiments, as shown for example in FIG. 4, characterizing batteries can include, for each battery of a set of characterization batteries: physical battery characterization S120 (e.g., physics based characterization to measure battery properties particularly physical properties) and iteratively performing: battery aging S140 (e.g., applying a battery aging cycle spanning a range battery properties such as depth of discharge, temperature, charge rate, etc.) and battery recharacterization S160 (e.g., physical battery characterization) and/or golden sequence characterization S180 (e.g., a blind characterization sequence for model, state estimator, and/or algorithm performance testing, where the blind characterization sequence can include testing a battery and comparing the measured battery properties to an estimated or predicted battery response). The battery aging (characterization) and recharacterization and/or golden sequence characterization can be repeated a predetermined number of times (e.g., a target number of cycles), until the battery capacity is at most a threshold battery capacity, for a predetermined length of time (e.g., 1 hour, 1 day, 1 week, 1 month, 1 year, etc.), until an anomaly occurs, and/or until any suitable criterion is meet.

In a first illustrative example, a characterization profile can include: discharge the battery (or a cell thereof) at a first rate (e.g., a slow rate such as I=C/(50 h)), resting the battery for a rest period (e.g., between 5 minutes and 100 hours), charging the battery (or cell thereof) at a second rate (e.g., the same or a different rate as the battery was discharged), and optionally repeating the cycle of discharging and charging the battery with periods of rest in between. In this example, the open circuit voltage can be determined by averaging the charge and discharge voltage. In this specific example, the internal resistance can be determined according to $R_{int}(s)=I/(U(s)-V(s))$. Variations of this illustrative example can be performed at different temperatures to determine the open circuit voltage and/or $R_{int}$ as functions of temperature. Variations of this illustrative example can be performed at different battery lifetimes (e.g., ages) to determine the open circuit voltage and/or $R_{int}$ as functions of battery age.

In a second illustrative example, a characterization profile can include: discharge the battery (or a cell thereof) at a first rate (e.g., I=C/(1 min), C/(5 min), C/(10 min), C/(20 min), C/(1 hr), C/(2 hr), C/(5 hr), C/(10 hr), C/(24 hr), C/(48 hr), C/(100 hr), C/(1 week), etc.), charging the battery (or cell thereof) at a second rate (e.g., the same rate as the battery was discharged, a slower rate than the battery was discharged, a faster rate than the battery was discharged, etc.), and optionally repeating the cycle of discharging and charging the battery. In this example, the internal resistance can be determined according to $R_{int,\,ohmic}(s)+R_{int,\,conc}(s,I)=I/(U(s)-V(s))$. $R_{int,conc}(s,I)$ can be determined by repeating the charging and discharging at different currents I. Variations of this illustrative example can be performed at different temperatures to determine $R_{int,conc}$ as functions of temperature. Variations of this illustrative example can be performed at different battery lifetimes (e.g., ages) to determine $R_{int,conc}$ as functions of battery age.

In a third illustrative example, batteries can be characterized using calorimetry to determine a cell and/or battery thermal mass.

In a fourth illustrative example, a state of charge of a battery can be characterized according to a voltage method, for instance, using a known discharge curve for the battery. As the voltage can change or depend on the temperature and/or the battery's current (e.g., because of electrochemical kinetics), the state of charge is generally characterized by the voltage method after a rest of at least 4 hours since charging or discharging the battery. However, the state of charge of the battery can be characterized using a chemical method (e.g., based on a specific gravity or pH of an electrolyte as measured using a hydrometer, refractometer, etc.), using current integration, a pressure method, and/or using any suitable method.

In a fifth illustrative example, a characterization profile can include a pulsed characterization (e.g., DC pulse current signal such as pulse power tests or Hybrid Pulse Power Characterization (HPPC) tests; AC current signals such as electrochemical impedance spectroscopy (EIS); using pulse-multisine measurements; etc.). In this illustrative example, the pulsed characterization can be used to determine a resistance of the battery (e.g., internal resistance), a resistance of a modeled subcomponent (e.g., an internal resistance due to one physical component such as a cell, wall, interface, air gap, etc.), a relaxation behavior of the battery and/or component thereof (e.g., a capacitance of the battery), and/or any other parameters (e.g., equivalent circuit parameters) of the battery or its subcomponents. However, the pulsed characterization can otherwise be used.

However, the batteries can be characterized in any manner.

Determining one or more models S200 functions to generate one or more battery models. The battery models are preferably generated using model data. The model data preferably includes the characterization dataset (e.g., generated in S100), but can additionally or alternatively include data from batteries operated in the field (e.g., historic data, data from ongoing measurements such as those in S300, etc.), data acquired by a battery manufacturer, from data for different battery types or classes, and/or any suitable data. S200 is preferably performed by a model generator (e.g., of a cloud computing system), but can be performed by any suitable module or component. S200 is preferably performed after S100, but can be performed at the same time as S100, before S100 and/or at any suitable time.

The one or more models can be formed by fitting the model data, using machine learning, joint parameter refinement, and/or otherwise determining one or more model terms. The one or more models can be determined automatically (e.g., without operator intervention) and/or manually. For example, a model dataset can be automatically fit to a predetermined parameterization of or for a model. The model dataset can be fit using a least-squares approach, a weighted least squares approach, a linear least squares approach, a non-linear least squares approach, least absolute deviations approach, M-estimation approach, and/or using any suitable approach.

The set of one or more models are preferably modular (e.g., able to be switched from one model to another model within the set), but can be non-modular (e.g., difficult to or unable to switch from one model to another model within the set), and/or have any suitable property. In a first variation, S200 generates a battery model specific to the battery (e.g., battery pack, cell, system, etc.), wherein the output battery state predictions are provided to generic analysis models for monitoring and analysis. In a second variation, S200 generates a different model for each battery-analysis combination (e.g., for all battery states, for a specific set of battery states, etc.).

The parameterization for a model can be determined automatically and/or manually. For instance, the open circuit voltage can (automatically) be parameterized as a function of state of charge, temperature, and/or age. In a second example, a machine learning algorithm (e.g., a neural network) can be used to determine or select a parameterization for a model dataset. However, the model dataset can be parameterized in any suitable terms. Similarly, the functional form of the parameterization can be automatically and/or manually determined (e.g., at the same time as the parameterization, in the same or different manner as the parameterization).

Fitting the model dataset can include determining parameters associated with a given parameterization. In some variants, determining the parameters can determine the functional form for the parameterization (e.g., a polynomial order can be determined by the fit). The parameters can be estimated using: probability plotting, rank regression (e.g., approaches like a least-squares approach, a weighted least squares approach, a linear least squares approach, a nonlinear least squares approach, least absolute deviations approach, M-estimation approach, etc.), maximum likelihood estimation, Bayesian estimation methods, and/or using any suitable method(s).

In some variants, each model can be fit using a different approach, using a different parameterization (e.g., a different test parameterization, different functional form of the parameterization, etc.), and/or in any suitable manner.

The models can be determined using characterization measurements (e.g., from S100's physical characterization), from simulated data (e.g., from S100's simulation), and/or using other data. In one example, physical battery models (e.g., thermal models, electrical degradation models, electrothermal models, circuit models) are determined based on the characterization measurements. The physical battery models are then used to simulate battery responses (e.g., predict new battery states) given scenarios of different types (e.g., normal, abnormal, etc.). The input battery state, output battery state, and optionally the scenario type label can then be used to train analysis models (e.g., anomaly detection models, planning models, warranty status models, etc.). For example, an anomaly detection model can be trained using the output battery state and the scenario type label as training targets. In a second example, a depth of cycle planning model can be trained using the depth of cycle from the simulation's input battery state as a training target. However, the analysis models can be otherwise determined.

S200 can include selecting a model from a plurality of models S220, validating one or more models S240, and/or any suitable steps.

Selecting the model S220 from a plurality of models functions to choose a model for use in state estimation and/or state simulation for a battery. The model can be selected automatically or manually. The model can be selected based on: an accuracy of the model, a speed of the model, a validation of the model, a processing power necessary to run the model, a frequency of model updates, a time between model updates, an ability of a model to predict one or more anomalies, an application or operation of the battery or external system, an operator preference, and/or any suitable information or trigger. By way of example, for a satellite system, a model that parameterizes or accounts for the effects of pressure (e.g., vacuum) in one or more terms can be selected or preferred. However, any suitable model can be selected.

Validating the model(s) S240 functions to ensure that a model produces valid results. Each model can be validated, the selected model can be validated, a subset of models can be validated (e.g., any model that meets or exceeds a validation criterion can be validated), and/or any suitable model(s) can be validated. The model(s) are preferably validated using a validator (e.g., of a computing system), but can be validated by any suitable computing system component and/or any suitable component.

The models can be validated using a validation dataset. The validation dataset can include: the characterization dataset, a subset of the characterization dataset, a historic dataset (e.g., for battery operation in the field), and/or any suitable dataset.

The model(s) are preferably validated when they at least meet a validation criterion. Exemplary validation criterion can include: a model accuracy, a model speed, a model computation time, model performance, a threshold difference between the validation dataset and a battery state simulated according to a model, a threshold match between the validation dataset and a battery state simulated using the model, and/or any suitable criterion can be applied.

In an illustrative example, validating a model can include comparing a simulation of a battery state (e.g., a battery state of charge) with measurements of the battery state from a battery with similar starting conditions and load profile. The battery was preferably not included in the characterization set (e.g., the measurements were not used to generate the model); however, the battery could be in the characterization battery set. When the simulation of the battery state and the measurements match (e.g., agree within a threshold, maximum absolute difference between the two is at most a threshold, etc.), the model can be validated.

However, the model(s) can otherwise be validated.

Receiving battery properties S300 functions to receive measurements for one or more battery properties for a battery. In general, the battery is not in the characterized battery set, but preferably shares characteristics (e.g., make, model, battery pack design, etc.) with the characterized battery set; alternatively, the battery can be completely different. However, the battery can be a characterized battery. The battery can refer to an actual battery and/or a characteristic battery (e.g., a characteristic battery representing a cluster of batteries from a battery fleet). The battery properties are preferably measured using a sensor (e.g., a sensor integrated into the battery), but can be measured using any suitable sensors or other instruments. The battery properties can be measured while a battery is in operation, before the battery is used to perform an operation (e.g., immediately prior to, a predetermined time before, etc.), after the battery has been used for an operation (e.g., immediately after, a predetermined time after, etc.), and/or with any suitable timing. The battery properties can be received from the sensor, from a storage module (e.g., memory) of the computing system, and/or from any suitable source.

In some embodiments of S300, the battery properties (particularly those measured using sensors) can be processed for instance using a soft sensor. In an illustrative example, peaks (e.g., spikes) in the battery property measurements can be identified and processed (e.g., counted). The readings from or processed by the soft sensor can be used, for example, to monitor the battery (e.g., with or without a full state estimation), as a trigger or indication for a need for model updates (e.g., as a trigger to perform an instance of a slow model), as training data (e.g., for model generation, for model validation, for state generation, etc.), be used as an input to the state estimator, and/or otherwise be used.

Determining the battery state S400 functions to calculate, estimate, generate, and/or otherwise determine the battery state (e.g., current battery state, future battery state, previous battery state, etc.) for a given battery. The battery state can be determined using a state estimator, a simulation engine, and/or any suitable component. The battery state can be determined at a local computing system and/or a remote computing system. The battery is typically not a battery from the characterization set of batteries, but the battery can be from the characterization set of batteries. S400 preferably uses battery properties (e.g., measured in S300, determined from the battery fleet or a subset thereof, etc.) and a load profile (e.g., predicted load profile, historic load profile for a route or external system operation, manually generated load profile, automatically generated load profile, etc.) to determine the battery state. However, the battery state can be determined using any suitable inputs to the state estimator.

The state estimator and/or simulation engine preferably uses the selected model (e.g., from the models generated in S200), but can use a plurality of models (e.g., to determine a plurality of battery states, where a final battery state can be determined by combining such as averaging the plurality of battery states), and/or any suitable model. The model can be generated (and/or selected) in real- or near-real time (e.g., S200 can be performed in succession with or within a predetermined time of S400), accessed from a storage module, be hard-coded into the state estimator, transmitted to the state estimator, and/or otherwise be generated.

The battery state can be determined for a given battery or external system, a set of batteries or battery systems of a fleet, a representative battery (e.g., a medoid, median, modal, extrema, etc. battery of the fleet or a cluster or grouping of batteries thereof), a hypothetical battery or external system, and/or for any suitable battery or external system. The hypothetical battery or external system preferably has properties that are representative of one or more batteries of the fleet. In a first example, the hypothetical battery can have typical properties (e.g., 50% percentile for one or more properties, average properties, median properties, modal properties, etc. for the fleet and/or for a cluster or subset of battery or external systems; properties associated with a centroid of a cluster of managed systems; etc.). In a second illustrative example, the hypothetical battery and/or external system can have a predetermined set of properties (e.g., one or more properties at the $1^{st}$, $2^{nd}$, $5^{th}$, $10^{th}$, $20^{th}$, $30^{th}$, $40^{th}$, $50^{th}$, $60^{th}$, $70^{th}$, $80^{th}$, $90^{th}$, $95^{th}$, $98^{th}$, $99^{th}$, etc. percentile for the fleet and/or for a cluster of battery or external systems). In a third illustrative example, the method can be performed using (measured or determined) properties for a battery or external system (with or without creating a buffer around the values).

The battery state can be determined in real- or near-real time (e.g., during operation of the battery or external system), prior to operation of the battery or external system (e.g., using a previously measured or determined battery state and/or set of battery properties), after operation of the battery or external system (e.g., to validate and/or provide additional validation data for the model or state estimator), and/or with any suitable timing.

The battery state can optionally be scaled to or by the received battery properties (e.g., as received in S300), the initial battery properties (e.g., battery properties at the beginning of life), the final battery properties (e.g., the battery properties predicted or anticipated at the end of life of the battery), and/or any suitable battery properties.

The state estimator is preferably a validated state estimator (e.g., validated by a validation engine), but can be an unvalidated state estimator, a previously validated state estimator, and/or any suitable state estimator. The state estimator can be validated by (e.g., validating the state estimator S260 can include): comparing a result of an unvalidated state estimator to a validated state estimator, using a validated state estimator to generate a state estimator (e.g., where the generated state estimator can have a validity conferred by the validated state estimator, where the validated state estimator can estimate the validity or quality of the generated state estimator, etc.), comparing estimated battery states (e.g., determined using the state estimator) for a battery to historic battery states (e.g., measured battery states) for the battery, determining whether a validation criterion (such as an accuracy of the battery state, a precision of the battery state, a speed of the state estimator, etc.) is satisfied, comparing a simulated battery state (e.g., determined by a simulation engine using a validated or not validated model) and an estimated battery state (e.g., determined using a state estimator), and/or the state estimator can otherwise be validated. The state estimator can be validated indefinitely, until the state estimator is updated (e.g., in S500), for a predetermined amount of time, until a quality of the battery states generated by the state estimator fall below a validation metric, until the state estimator no longer meets the validation criterion, and/or for any suitable time or responsive to any suitable criterion. In an illustrative example, when an estimated state and a simulated state match (e.g., within a threshold of each other, a maximum absolute difference less than a threshold, etc.), the state estimator can be validated. In a second illustrative example, when an estimated state and a measured state (e.g., historic state, current state compared to a forward propogated estimated state, etc.) match (e.g., within a threshold of each other, a maximum absolute difference less than a threshold, etc.), the state estimator can be validated. However, the state estimator can otherwise be validated.

In a first specific example, the battery state can be determined by an unscented Kalman filter processing battery properties. In a second illustrative example the parameters associated with a Kalman filter can be determined from a look-up table (e.g., where the Kalman filter parameters can be identified based on the battery properties). In the second illustrative example, the Kalman filter can use the determined parameters (and the battery properties) to determine the battery state. However, the battery state can be determined in any manner.

In an illustrative example, the input battery properties can include: temperature (e.g., internal temperature, surface temperature, etc.), current, voltage, resistance (e.g., total resistance, ohmic resistance, concentration resistance, etc.), and/or state of charge of the battery. In this illustrative example, the battery state can include: battery properties (e.g., filtered or actual values for input or other battery properties), battery state of health, one or more anomaly states (e.g., a state that is correlated with and/or predictive of occurrence of an anomaly), one or more model parameters (e.g., active model parameters), an error for one or more other states, and/or any suitable outputs. In a variation on this illustrative example, the input battery properties can include battery properties associated with a plurality of batteries from the fleet. In this variation, the battery state of one or more batteries (e.g., batteries of the fleet) can be output. However, any suitable inputs and/or outputs can be used.

Updating the model(s) S500 preferably functions to update one or more of the generated models (e.g., generated in S200). In particular, the selected model is updated; however, any model(s) of the set of models can be updated. The models can be updated by the state estimator, the model generator, an operator, and/or any suitable computing system or component. The updated models can be determined at the local computing system and/or a remote computing system. S500 can be performed at the same time as, before, and/or after S400.

The model(s) can be updated: at a predetermined time, at a predetermined frequency, when model updates are available, during battery charging, during battery operation, when a model update criterion is met, randomly, pseudorandomly, when new battery properties are measured or received, and/or with any suitable timing. The model(s) can be updated automatically and/or manually.

A model update criterion (e.g., condition or criterion upon in response to which the model can be updated) can include: an accuracy of the model, a change in the application or operation of the battery or external system, a change (e.g., increase or decrease) in the processing power of the computing system running the state estimator (or simulation engine), new models being generated, a model no longer being validated, new states being identified, a threshold battery property (e.g., when a battery achieves a predetermined age, the model can be changed), a threshold change in model parameter, and/or for any suitable criterion.

The model(s) are preferably updated seamlessly (e.g., with a downtime where the model cannot be used to determine the state is less than a threshold downtime, without being perceived by the operator, etc.). However, the model(s) updates can be nonseamlessly (e.g., perceivable to an operator), and/or otherwise occur. In a specific example, the models can be updated when the battery is substantially inoperable (such as while the battery is charging).

Updating the models can include: changing (e.g., updating, modifying, etc.) one or more parameters of the model, changing (e.g., updating, modifying, etc.) the parameterization of the model, switching the model for a different model (e.g., changing from a first submodel to a second submodel), and/or otherwise updating the model. In an illustrative example, updating the model can include changing a model parameter to a model parameter determined by the state estimator. In a variation of this example, the model parameter can be changed when the model parameter determined by the state estimator differs from the previous model parameter by a threshold amount (e.g., 0.001%, 0.01%, 0.05%, 0.1%, 1%, 2%, 3%, 5%, 10%, 20%, 50%, 100%, 200%, 500%, 1000%, values therebetween, etc.). However, the models can be updated in any manner.

Figure 6:
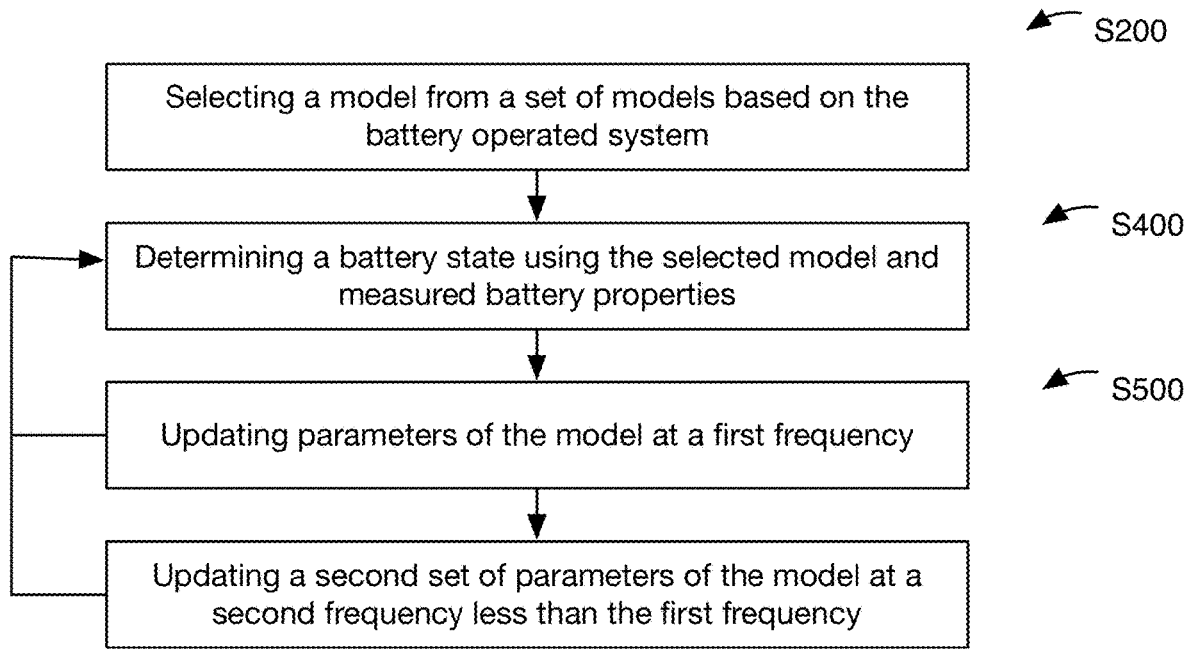
FIG. 6 is a flow chart for an example of updating a model.

Embodiments of S500 can include updating the model on a plurality of differing time scales (as shown for example in FIG. 6). For example, the models can be updated on a fast time scale (e.g., milliseconds to hours) and a slow time scale (e.g., hours to years). In general, the model updates on different time scales change different sets of parameters; however, the model updates on different time scales can change the same set of model parameters. Alternatively phrased, different model updates (e.g., time scales) generally have different, but can have the same, active and inactive parameters. The model updates (e.g., updated model parameters) on differing time scales can be determined using the same update source (e.g., the same state estimator) or different source (e.g., different state estimators).

Slower or less frequent model updates are generally performed using additional data (e.g., from other batteries, from sensors or data sources with high latency, infrequent data sources, etc.) relative to faster or more frequent model updates. However, the slower or less frequent model updates can be performed using the same or less data than the faster or more frequent model updates (e.g., when the slower model updates are determined using a more computationally intensive or slower state estimator than the faster model updates). In an illustrative example, the slower or less frequent model updates can be determined at a cloud computing system and the faster or more frequent model updates can be determined by the edge computing system. However, the slower model updates can be performed while the battery is charging, on the edge computing system, and/or at any computing system. Similarly, the faster model updates can be performed while the battery is charging, on the cloud computing system, and/or at any suitable computing system.

Embodiments of S500 can include receiving (e.g., downloading) a new set of model parameters (e.g., where the previous model parameters are updated to the new set of model parameters). These embodiments can be particularly, but not exclusively, beneficial when a battery changes (e.g., one or more batteries of the fleet are changed to a new battery such as a new battery type, a new battery manufacturer, etc.) and can enable the models to be updated with few or no changes to the code (e.g., state estimator, simulator, algorithm, etc.). In these embodiments, the new set of model parameters are preferably derived from characterized batteries that are similar to or the same as the new batteries. However, the new set of model parameters can otherwise be derived. The new set of model parameters can be determined in real- or near-real time (e.g., according to S400), be predetermined (e.g., in S200 such as using a characterization of a second set of characterization batteries), and/or can otherwise be determined. The new set of model parameters can be automatically received (e.g., when a battery changes) and/or be received manually (e.g., an operator or fleet manager request). In variants of these embodiments, the new model parameters can be used to determine (e.g., test) an impact (e.g., performance, lifetime, cost, etc.) of changing batteries.

Transmitting the battery state S600 functions to transmit the battery state to a battery or fleet operator. S600 is preferably performed after S400, but can be performed at the same time as S400 and/or before S400 (e.g., to transmit a past battery state). The battery state can be transmitted to an operator device 400 (e.g., smart phone, smart device, computer, laptop, etc.), display, and/or to any suitable device. The current battery state, a future battery state (e.g., simulated battery state, forward-estimated battery state, etc.), and/or historic battery state can be transmitted.

Transmitting the battery state can include: displaying the battery state (and/or any suitable states thereof), operating the external system based on the battery state, providing recommended or updated operation instructions for an external system (e.g., providing a recommend operator profile such as aggressiveness, defensiveness, etc.; a load profile; a path; an operation time; an operation order; stops to make; an acceleration profile; a velocity profile; a timing for performing state estimation; charging time; extent of charging before operation; charge rate; etc.), informing battery design and/or selection (e.g., the types and/or number of sensors; the data acquisition rate; the anode, cathode, electrolyte, and/or separator; cell size, cell arrangement, cell number, etc.; pack size, pack geometry, thermal interfaces between cells, between the pack and the external system, etc.; etc.), issuing a flag or warning for an anomaly, and/or otherwise process or operate on the battery state.

Transmitting the battery state can include: determining a probability or risk of an anomaly occurring, determining a probability or risk for an insurance event, determining a probability or risk of maintenance being necessary or recommended, and/or otherwise determining a probability of rare events. The rare events are generally determined using states or combinations of states that were identified (e.g., trained on) datasets including the occurrence of the rare events (e.g., actual events, simulated events, etc.). However, the rare events can be determined based on any suitable states. A flag (or other message such as a visual, textual, or audio message) indicating the rare event can be issued when the probability of the rare event exceeds a threshold (e.g., operator set threshold, predetermined threshold probability such as 1%, 2%, 5%, 10%, 20%, 25%, 30%, 50%, 70%, 75%, 80%, 90%, 95%, 99%, etc.), and/or in any suitable circumstance. In some variants, when the probability of a rare event exceeds a threshold, the method can include operating the external system (e.g., stopping the external system, changing operation properties of the external system, etc.) to decrease the probability of the rare event from occurring.

5. Specific Examples

In a first example, battery states can be used to retire batteries at (true) end of life, to maximize useful work, or to maximize battery (or external system) resale value.

In a second example, battery states can be used to trigger maintenance or shutdown for one or more battery or external systems.

In a third example, battery states can be used to verify functionality or degradation state of a used battery.

In a fourth example, battery states can be used to predict pricing (e.g., based on remaining useful life under relevant conditions) for a used battery.

In a fifth example, battery states can be used to infer expected load profile of one or more vehicle drivers (e.g., based on driving or riding style) and use the inferred load profile to estimate vehicle range.

In a sixth example, battery states can be used to infer expected load profile of one or more energy storage systems (e.g., based on historical use case data) and use the inferred load profile to determine how to operate the battery or external system to optimize use or minimize asset depreciation.

In a seventh example, battery states can be used to determine (e.g., optimize) operation parameters for the external system based on expected degradation and conditions.

In an eighth example, battery states can be used to determine a battery pack design (e.g., cell placement, heat transfer coefficient, geometry, temperature sensor placement, etc.) for the battery or external system based on specified operation tolerances.

In a ninth example, battery states can be used to determine a battery pack load profile and usage algorithms given a specified application (e.g., Unmanned Aerial Vehicle, Telecom Asset, Satellite, etc.).

In a tenth example, battery states can be used to determine a battery charge profile (e.g., including "fast charging" or "extra fast charging") given a specified application (e.g., Unmanned Aerial Vehicle, Telecom Asset, Satellite, etc.).

In an eleventh example, battery states can be used to identify changes to cell charge or discharge processes to optimize for one or more of: mass, volume, instantaneous power, total energy stored, and calendar life.

In a twelfth example, battery states can be used to design battery cells or packs (e.g., determine now to place temperature sensors, other components, materials, etc.).

In a thirteenth example, battery states can be used to evaluate sensitivity of a battery control system to detecting abuse conditions.

In a fourteenth example, battery states can be used to evaluate safety of a battery control system.

In a fifteenth example, battery states can be used to determine (e.g., optimize) performance of a communication system (e.g., ground communication, satellite communication) that is powered by a solar system coupled to a battery storage array. Communication system power consumption (e.g., transmission power, bandwidth, etc.) and depth of charge configuration can be optimized based on expected solar generation (e.g., satellite orbit data, weather data, etc.).

In a sixteenth example, battery states can be used to determine (e.g., optimize) control of the battery or external system based on local temperature or weather conditions for work performed using a distributed grid storage or cell network environment. Financial value of grid tasks performed by a fleet of batteries can be optimized based on present and predicted battery degradation.

In a seventeenth example, battery states can be used to assign battery tasks of varying intensity or other varying qualities (e.g., length, distance, power required, etc.) to multiple systems in a fleet where those systems have different output values. For example, by using battery states to determine the most appropriate task for each system to perform to minimize its expected degradation or maximize the value of the task done (either at the individual system scale, at the cluster of systems scale, and/or at the fleet scale).

Figure 11:
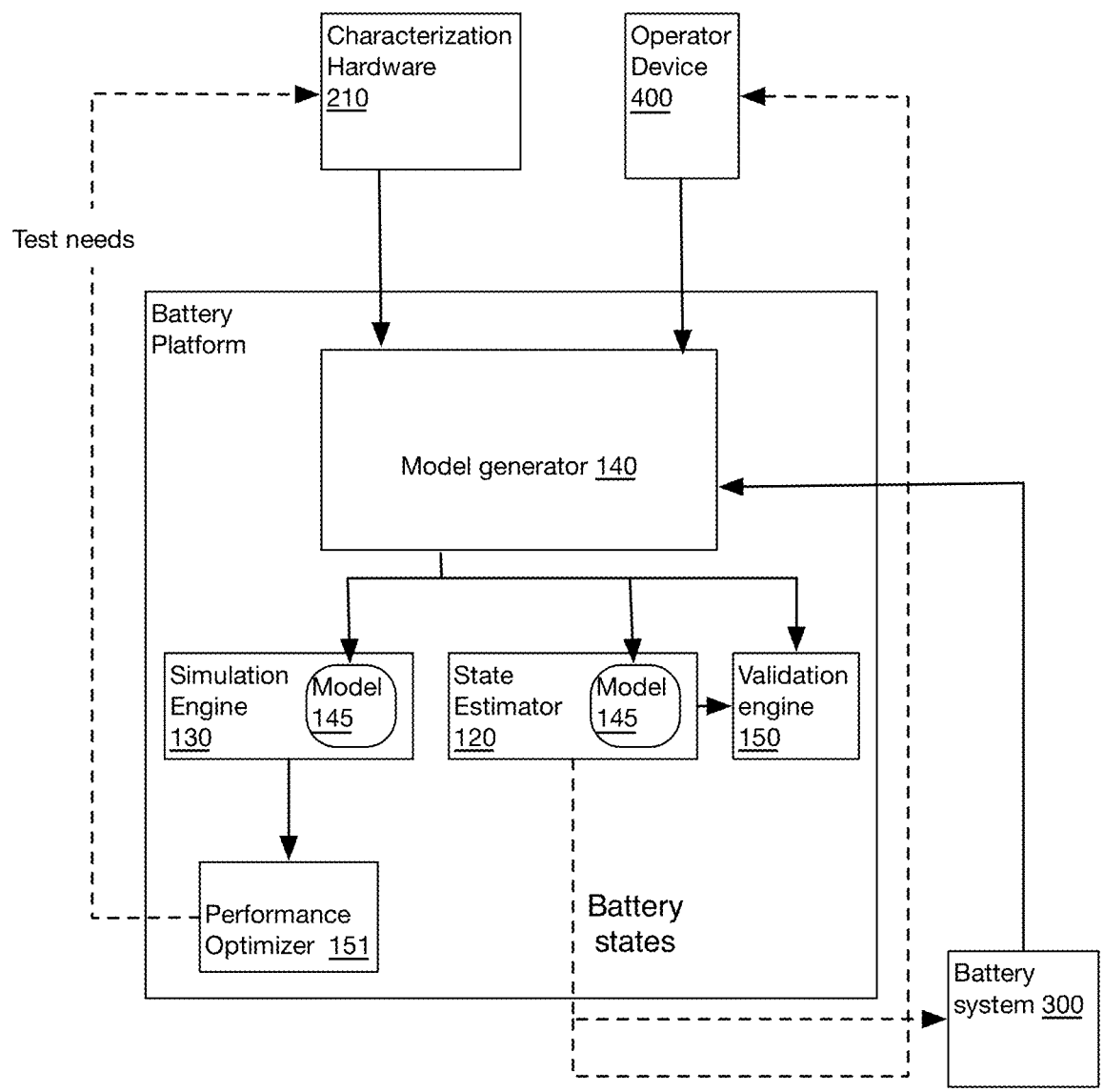
FIG. 11 is a schematic representation of an exemplary battery platform.

In an eighteenth example as shown in FIG. 11, a system for determining battery states can include: an operator device, characterization hardware, a model generator, a simulation engine, a state estimator, a validation engine, a battery or external system, and a model. The system can optionally include a performance optimizer which can function to generate data (e.g., training data) for determining (e.g., generating, identifying, etc.) battery states (e.g., battery states of interest, anomaly states, maintenance states, etc.).

Figure 5:
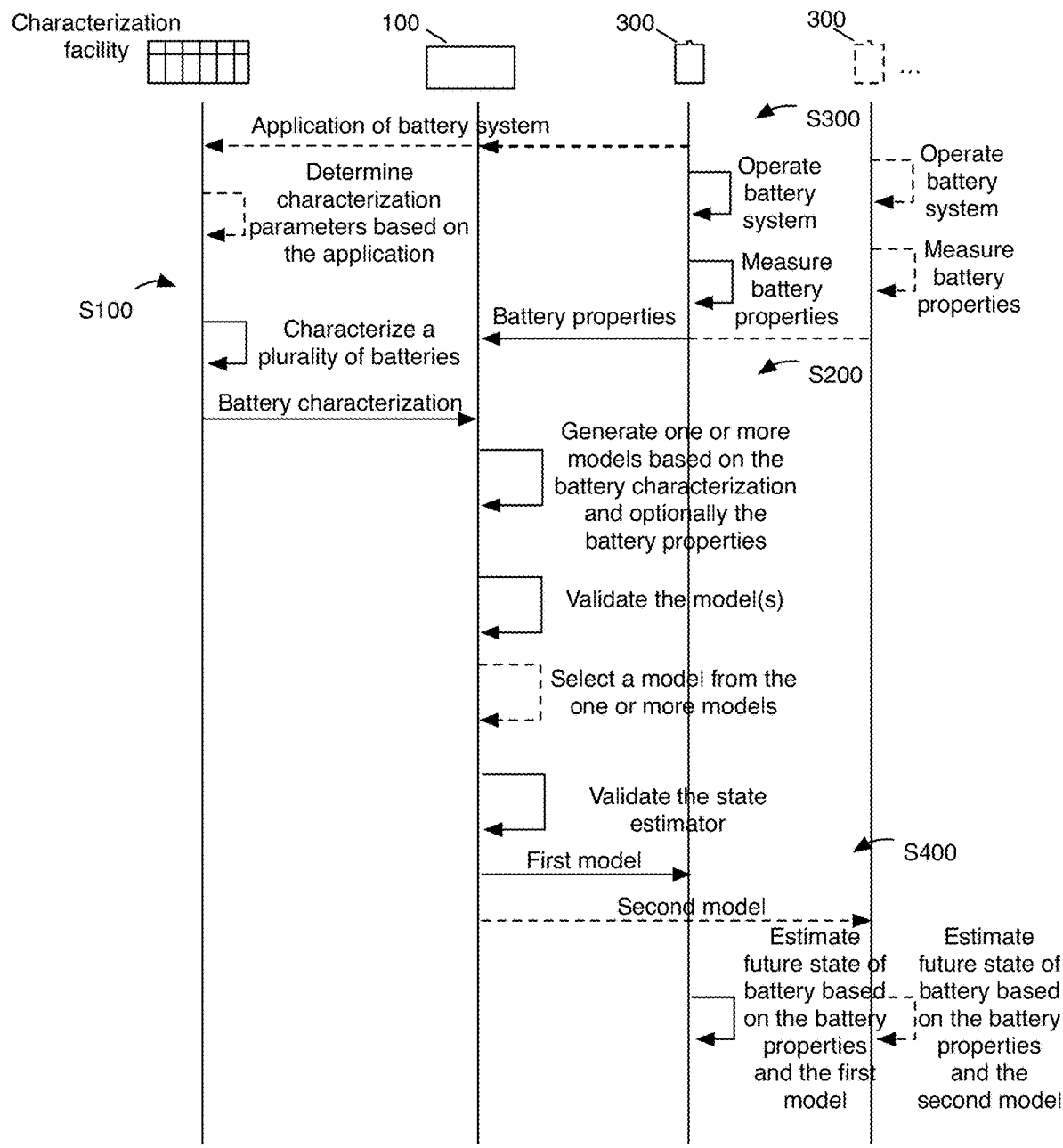
FIG. 5 is a flow chart for an exemplary embodiment of the model.

In a nineteenth example as shown in FIG. 5, a method can include determining an application or operation for a battery; characterizing a set of characterization batteries (e.g., batteries that are substantially identical to the battery to be estimated); generating one or more models based on the battery properties associated with the set of characterization batteries and optionally with battery properties associated with batteries operating outside of the characterization facility; validating the one or more models; validating a state estimator; and estimating a battery state using the state estimator, a model (e.g., a model selected from the one or more models based on the application or operation of the battery), and the battery properties.

Figure 17:
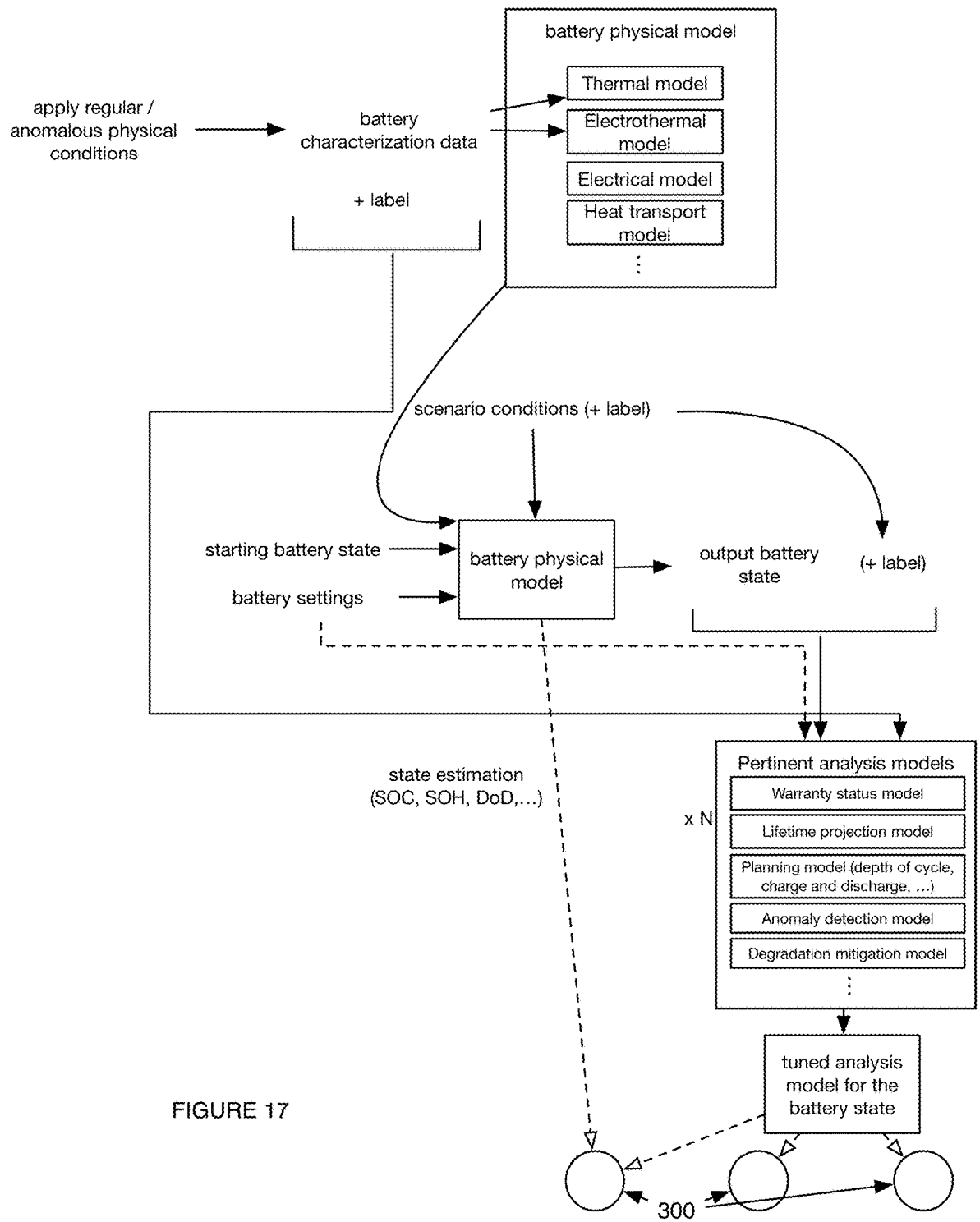
FIG. 17 is a schematic representation of an example of generating physical models and analysis models.

In a twentieth example as shown in FIG. 17, a method can include applying a set of conditions (e.g., normal conditions, anomalous conditions, etc.) to a set of characterization batteries, characterizing the response of the characterization batteries to the set of conditions, generating physical battery models (e.g., electrical models, heat generation models, electrothermal models, heat transport models, etc.) based on the characterization data sets, simulating a response of a battery to simulated conditions (e.g., normal conditions, anomalous conditions, etc.), generating analysis models (e.g., warranty status models, lifetime projection models, anomaly state models, planning models, degradation mitigation models, etc.) based on the simulated responses and optionally labels for the types of simulated conditions (e.g., 'anomalous' vs 'normal'), and transmitting the tuned analysis models to the battery and/or external system.

However, the system and/or method can include any suitable components and/or steps.

The methods of the preferred embodiment and variations thereof can be embodied and/or implemented at least in part as a machine configured to receive a computer-readable medium storing computer-readable instructions. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A method comprising:
   for each battery of a plurality of batteries:
   applying a load profile to the respective battery; and
   characterizing a response of the respective battery to the applied load;
   generating a set of models based on the responses, wherein each model comprises at least one of:
   a thermal model;
   an electrochemical model; or
   a heat generation model;
   validating a model of the set of models;
   measuring battery properties of a second battery using a sensor; and
   using a state estimator to determine a state of the second battery based on the battery properties and the validated model.

2. The method of claim 1, wherein validating the model comprises validating the model by comparing historic battery data to simulated battery data generated using the model.

3. The method of claim 2, wherein the model of the set of models is validated when the historic battery data and the simulated battery data match to within a threshold.

4. The method of claim 1, further comprising, validating the state estimator.

5. The method of claim 4, wherein validating the state estimator comprises comparing a measured battery state to an estimated state determined using the state estimator.

6. The method of claim 5, wherein the state estimator is validated when the measured battery state and the estimated battery state match to within a threshold.

7. The method of claim 1, wherein the applied load comprises a chirped electrical load, wherein the response is measured during and after the chirped electrical load is applied.

8. The method of claim 1, wherein the second battery is integrated into one of: an electric passenger vehicle, an electric bicycle, an electric power tool, an electric airplane, construction equipment, or a satellite.

* * * * *